(12) United States Patent
Song

(10) Patent No.: US 11,676,651 B2
(45) Date of Patent: *Jun. 13, 2023

(54) ARITHMETIC DEVICES CONDUCTING AUTO-LOAD OPERATION

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/747,595

(22) Filed: May 18, 2022

(65) Prior Publication Data

US 2022/0277783 A1    Sep. 1, 2022

Related U.S. Application Data

(60) Division of application No. 17/125,671, filed on Dec. 17, 2020, now Pat. No. 11,386,947, which is a continuation-in-part of application No. 16/919,786, filed on Jul. 2, 2020.

(60) Provisional application No. 62/959,593, filed on Jan. 10, 2020, provisional application No. 62/959,574, filed on Jan. 10, 2020, provisional application No. (Continued)

(30) Foreign Application Priority Data

Oct. 31, 2019  (KR) .................. 10-2019-0138114

(51) Int. Cl.
*G11C 11/408*     (2006.01)
*G11C 11/4091*    (2006.01)
*G11C 11/4074*    (2006.01)

(52) U.S. Cl.
CPC ...... *G11C 11/4082* (2013.01); *G11C 11/4074* (2013.01); *G11C 11/4087* (2013.01); *G11C 11/4091* (2013.01)

(58) Field of Classification Search
CPC .......... G06F 1/03; G06F 7/5443; G06F 7/523; G06N 3/0481; G11C 11/4091
See application file for complete search history.

(56) References Cited

U.S. PATENT DOCUMENTS 5,434,819 A    7/1995  Matsuo et al.
5,544,098 A *  8/1996  Matsuo ................. G11C 29/48
                                                714/719

(Continued)

FOREIGN PATENT DOCUMENTS

KR    1020180053314 A    5/2018
KR      102032146 B1    10/2019
KR    1020190116024 A   10/2019

*Primary Examiner* — Mushfique Siddique
(74) *Attorney, Agent, or Firm* — William Park & Associates Ltd.

(57) ABSTRACT

An arithmetic device includes an auto-command/address generation circuit, a first data storage circuit, and a second data storage circuit. The auto-command/address generation circuit generates an auto-load selection signal that activates an auto-load operation based on a level of a power source voltage. In addition, the auto-command/address generation circuit generates an auto-load command for the auto-load operation. The first data storage circuit outputs look-up table data, to which an activation function is applied, based on the auto-load command. The second data storage circuit stores the look-up table data, output from the first data storage circuit, based on the auto-load command.

9 Claims, 28 Drawing Sheets

Related U.S. Application Data

62/958,609, filed on Jan. 8, 2020, provisional application No. 62/958,614, filed on Jan. 8, 2020.

(56) References Cited

U.S. PATENT DOCUMENTS

| | | | |
|---|---|---|---|
| 5,715,203 A * | 2/1998 | Uchida | G11C 7/1072 365/230.06 |
| 5,768,617 A * | 6/1998 | Liu | G11B 20/10 710/266 |
| 6,414,687 B1 | 7/2002 | Gibson | |
| 6,879,540 B2 | 4/2005 | Maruyama et al. | |
| 7,333,372 B2 * | 2/2008 | Tanaka | G06F 1/24 365/230.01 |
| 7,913,013 B2 * | 3/2011 | Oikawa | G06F 13/364 710/110 |
| 2009/0046527 A1 * | 2/2009 | Ko | G11C 7/22 365/203 |
| 2017/0365306 A1 | 12/2017 | Ouyang et al. | |
| 2018/0136844 A1 | 5/2018 | Kim | |
| 2021/0132910 A1 | 5/2021 | Lee et al. | |
| 2021/0132911 A1 | 5/2021 | Song | |
| 2021/0132953 A1 | 5/2021 | Song | |
| 2021/0132954 A1 | 5/2021 | Song | |
| 2021/0133545 A1 | 5/2021 | Song | |
| 2021/0133546 A1 | 5/2021 | Song | |
| 2021/0134349 A1 | 5/2021 | Song | |
| 2021/0158134 A1 | 5/2021 | Song | |
| 2021/0158852 A1 | 5/2021 | Song | |

\* cited by examiner

ARITHMETIC DEVICES CONDUCTING AUTO-LOAD OPERATION

CROSS-REFERENCE TO RELATED APPLICATIONS

The present application is a divisional application of U.S. application Ser. No. 17/125,671, filed on Dec. 17, 2020, which is a continuation-in-part of U.S. application Ser. No. 16/919,786, filed on Jul. 2, 2020, which claims the benefit of U.S. Provisional Application No. 62/958,614, filed on Jan. 8, 2020, U.S. Provisional Application No. 62/958,609, filed on Jan. 8, 2020, U.S. Provisional Application No. 62/959,574, filed on Jan. 10, 2020, and U.S. Provisional Application No. 62/959,593, filed on Jan. 10, 2020, and claims priority under 35 U.S.C 119(a) to Korean Application No. 10-2019-0138114, filed on Oct. 31, 2019, which are incorporated herein by reference in their entirety.

BACKGROUND

1. Technical Field

Embodiments of the present disclosure relate to arithmetic devices conducting an auto-load operation.

2. Related Art

In a neural network, neurons that are mathematically modelled to resemble to a human brain are connected to each other to form a network. Recently, neural network technologies have been developing rapidly. Accordingly, a lot of effort has been focused on analyzing input data and extracting useful information by using the neural network technologies in various electronic devices.

SUMMARY

According to an embodiment, an arithmetic device includes an auto-command/address generation circuit, a first data storage circuit, and a second data storage circuit. The auto-command/address generation circuit is configured to generate an auto-load selection signal that activates an auto-load operation based on a level of a power source voltage. In addition, the auto-command/address generation circuit is configured to generate an auto-load command for the auto-load operation. The first data storage circuit is configured to output look-up table data, corresponding to an activation function, based on the auto-load command. The second data storage circuit is configured to store the look-up table data, output from the first data storage circuit, based on the auto-load command.

According to another embodiment, an arithmetic device includes an auto-command/address generation circuit, a first data storage circuit, and a second data storage circuit. The auto-command/address generation circuit is configured to sequentially activate an auto-load selection signal and an auto-load command for an auto-load operation when a power-up pulse is activated, wherein the auto-command/address generation circuit is configured to change at least one of an auto-column address and an auto-row address for a next auto-load operation when the auto-load operation terminates. The first data storage circuit is configured to output look-up table data, corresponding to an activation function, based on the auto-load command. The second data storage circuit is configured to store the look-up table data, output from the first data storage circuit, based on the auto-load command.

According to yet another embodiment, there is provided a method of performing an auto-load operation. The method includes generating an auto-load selection signal that activates the auto-load operation, including an auto-read operation and an auto-write operation, based on a power source voltage. The method also includes performing the auto-read operation, when a selection read signal is activated, to have a first data storage circuit output look-up table data that corresponds to an activation function. The method also includes performing the auto-write operation, when a selection active signal, a selection write signal, and a selection pre-charge signal are sequentially activated, which stores the look-up table data that is output from the first data storage circuit during the auto-read operation, in a second data storage circuit.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
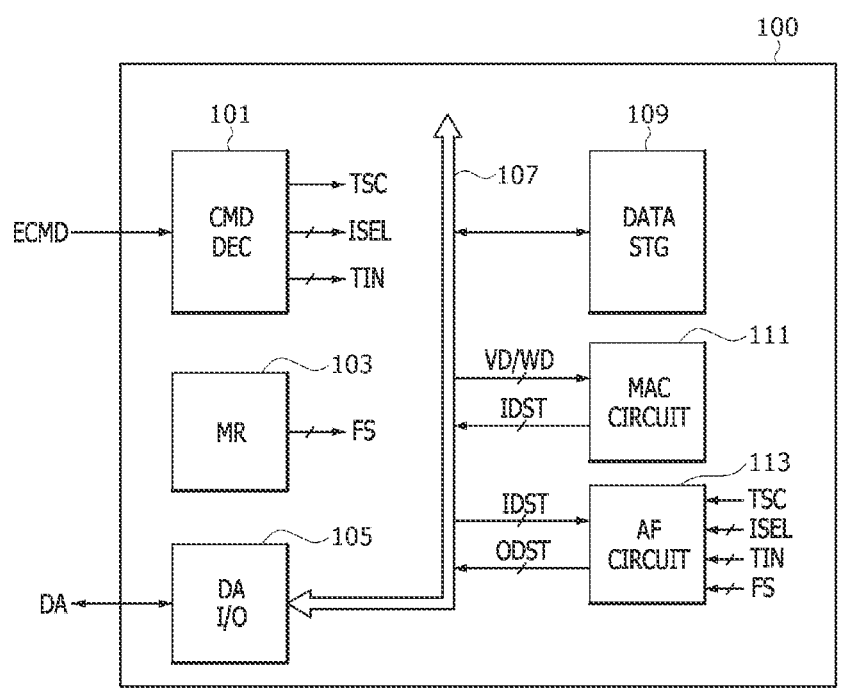
FIG. 1 is a block diagram illustrating a configuration of an arithmetic device according to an embodiment of the present disclosure.

As illustrated in FIG. 1, an arithmetic device 13 may include a command decoder 101, a mode register 103, a data input/output circuit 105, a data line 107, a data storage circuit 109, a MAC circuit 111 and an AF circuit 113.

The command decoder 101 may generate a table set signal TSC, an input selection signal ISEL, and a table input signal TIN based on an external command ECMD. The number of bits that are included in the input selection signal ISEL may be set to be different according to the embodiments. The number of bits that are included in the table input signal TIN may be set to be different according to the embodiments.

The command decoder 101 may decode external command ECMD to generate the table set signal TSC. The table set signal TSC may be activated to store an activation function used for a neural network into a first table storage circuit (133 of FIG. 3) in a look-up table form. The number of bits that are included in the external command ECMD for activating the table set signal TSC may be set to be different according to the embodiments. In addition, a logic level combination of the external command ECMD for activating the table set signal TSC may be set to be different according to the embodiments. The lookup table has a table form that contains information about an input value and the output value corresponding to the input value. When using the lookup table, the output value corresponding to the input value can be printed directly without any arithmetic, thus improving the arithmetic speed.

The command decoder 101 may decode the external command ECMD to generate the input selection signal ISEL and the table input signal TIN. The input selection signal ISEL and the table input signal TIN may be generated to store the activation function into first to $N^{th}$ variable latches (149_1~149_N of FIG. 4) included in the first table storage circuit (133 of FIG. 3) in a look-up table form. The table input signal TIN may be stored in one variable latch selected by the input selection signal ISEL among the first to $N^{th}$ variable latches (149_1~149_N of FIG. 4). A logic level combination of the external command ECMD for setting logic level combinations of the table input signal TIN may be set to be different according to the embodiments. A logic level combination of the external command ECMD for setting logic level combinations of the input selection signal ISEL may be set to be different according to the embodiments.

The mode register 103 may store a function selection signal FS through a mode register set. The mode register 103 may output the function selection signal FS through a mode register read. The mode register set and the mode register read are common operations for the mode register 139, so the specific description is omitted. The mode register 103 may apply the function selection signal FS to the AF circuit 113. The function selection signal FS may be generated to select one of various activation functions which are used for a neural network. The various activation functions used for a neural network may include, but are not limited to, sigmoid (i.e., sigmoid function), Tanh (i.e., hyperbolic tangent activation function), ReLU (i.e., rectified linear unit function), leaky ReLU (i.e., leaky rectified linear unit function), Maxout (i.e., max out activation function), and an activation function which is input based on the external command ECMD. The number of bits that are included in the function selection signal FS may be set to be different according to the embodiments. The mode register 103 can be located on the external side of the arithmetic device 13, for example, on a host or a memory controller.

The data input/output circuit 105 may receive external data DA from the external side of the arithmetic device 13, and transmit the external data DA to at least one of the data storage circuit 109 and the MAC circuit 111 through the data line 107. The data input/output circuit 105 may output data from at least one of the data storage circuit 109, the MAC circuit 111 and the AF circuit 113 through the data line 107 to the external data DA.

The data storage circuit 109 may be stored internally by receiving the external data DA received from the data input/output circuit 105 through the data line 107 in a write operation. The data storage circuit 109 may transmit the data that is stored internally to the data input/output circuit 105 through the data line 107 and output it to the external data DA in read operation.

The MAC circuit 111 may receive vector data VD and weight data WD. The MAC circuit 111 may receive the vector data VD from the data input/output circuit 105 or data storage circuit 109. The MAC circuit 111 may receive the weight data WD from the data input/output circuit 105 or data storage circuit 109. The MAC circuit 111 may perform MAC arithmetic operation on the vector data VD and the weight data WD, and generate an input distribution signal IDST based on the results of MAC arithmetic operation.

The MAC arithmetic operation may include a multiplying operation and an accumulating operation for the vector data VD and the weight data WD. When the vector data VD and the weight data WD are implemented in matrix format, the MAC arithmetic operations may include multiple multiplying operations and multiple accumulating operations for elements contained in matrix with the vector data VD implemented and elements contained in matrix with the weight data WD implemented. In the neural network, the MAC arithmetic operations are performed to classify features contained in an input layer into resulting values contained in an output layer. The vector data VD may contain information about features contained in the Input layer. The weight data WD may contain information about the influence on classifying features of the input layers as results contained in the output layers. The MAC circuit 111 may receive an output distribution signal ODST from the AF circuit 113 as the vector data VD when multiple layers are applied in perceptron.

The AF circuit 113 may store the activation functions used for a neural network into the first table storage circuit (133 of FIG. 3) in a look-up table form, based on the table set signal TSC, the input selection signal ISEL, and the table input signal TIN. The lookup table stored in the AF circuit 113 includes information on the relationship between the input distribution signal IDST and the output distribution signal ODST. The output distribution signal ODST can be defined as the value derived when the input distribution signal IDST is applied to an activation function. The AF circuit 113 may store the table input signal TIN into one variable latch selected by the input selection signal ISEL among the first to $N^{th}$ variable latches (149_1~149_N of FIG. 4) when the table set signal TSC is activated. Various activation functions used for a neural network, for example, sigmoid, Tanh, ReLU, leaky ReLU, and Maxout may be hardwired into the AF circuit 113. The number of the activation functions hardwired in the AF circuit 113 may be set to be different according to the embodiments.

The AF circuit 113 may select one of the various activation functions based on the function selection signal FS. The AF circuit 113 may generate a result value provided by an activation function selected by the function selection signal FS based on the input distribution signal IDST. The AF circuit 113 may extract a result value corresponding to the input distribution signal IDST from a look-up table to which an activation function selected by the function selection signal FS is applied, thereby outputting the result value as an output distribution signal ODST. A configuration and an operation of the AF circuit 113 will be described with reference to FIGS. 3 to 7.

Figure 2:
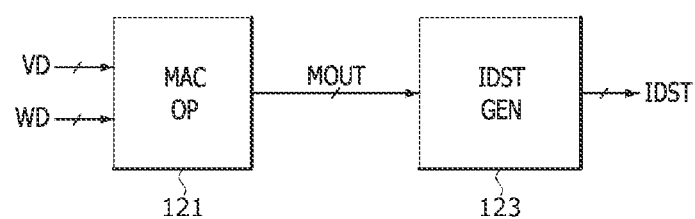
FIG. 2 is a block diagram illustrating a configuration of MAC circuit included in the arithmetic device of FIG. 1.

Referring to FIG. 2, the MAC circuit 111 may include a MAC operator 121 and an input distribution signal generation circuit 123. The MAC operator 121 may receive the vector data VD and the weight data WD and may perform the MAC arithmetic operation including a multiplying operation and an accumulating operation to generate an arithmetic result signal MOUT. The input distribution signal generation circuit 123 may extract only some bits among bits of the arithmetic result signal MOUT to generate the input distribution signal IDST. For example, when the arithmetic result signal MOUT contains bits corresponding to the integer and bits corresponding to the decimal part, the input distribution signal IDST can be selected as the bits corresponding to the integer from among the bits contained in the arithmetic result signal MOUT. The number of bits of the arithmetic result signal MOUT may be set to be different according to the embodiments. In addition, the number of bits of the input distribution signal IDST may also be set to be different according to the embodiments. The number of bits of the input distribution signal IDST may be set to be less than the number of bits of the arithmetic result signal MOUT.

Figure 3:
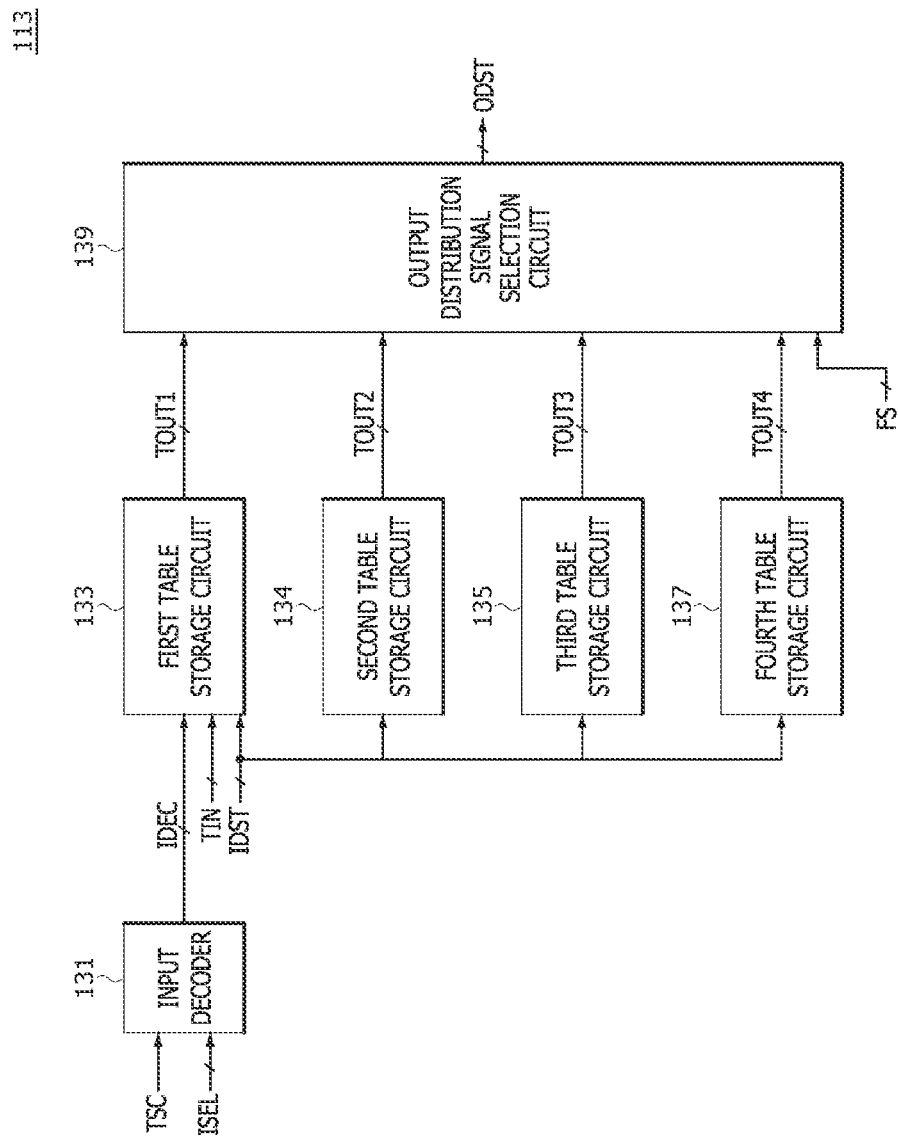
FIG. 3 is a block diagram illustrating a configuration of an AF circuit included in the arithmetic device of FIG. 1.

Referring to FIG. 3, the AF circuit 113 may include an input decoder 131, the first table storage circuit 133, a second table storage circuit 134, a third table storage circuit 135, a fourth table storage circuit 137, and an output distribution signal selection circuit 139.

The input decoder 131 may generate a decoded input signal IDEC based on the table set signal TSC and the input selection signal ISEL. The input decoder 131 may decode the input selection signal ISEL to generate the decoded input signal IDEC when the table set signal TSC is activated.

The first table storage circuit 133 may store the table input signal TIN and may output a first table output signal TOUT1, based on the decoded input signal IDEC and the input distribution signal IDST. The first table storage circuit 133 may store the table input signal TIN as a first activation function with a look-up table form based on the decoded input signal IDEC. The first table storage circuit 133 may output a result value of the first activation function as the first table output signal TOUT1 based on the input distribution signal IDST. A configuration and an operation of the first table storage circuit 133 will be described with reference to FIGS. 4 to 6.

A second activation function may be hardwired into the second table storage circuit 134. The second table storage circuit 134 may include logic circuits implemented in hardware with the second activation function. The second activation function may be set as one of sigmoid, Tanh, ReLU, leaky ReLU, and Maxout. The second table storage circuit 134 may output a result value of the second activation function stored in a look-up table form as a second table output signal TOUT2 based on the input distribution signal IDST. A configuration and an operation of the second table storage circuit 134 will be described with reference to FIG. 7.

A third activation function may be hardwired into the third table storage circuit 135. The third table storage circuit 135 may include logic circuits implemented in hardware with the third activation function. The third activation function may be set as one of sigmoid, Tanh, ReLU, leaky ReLU, and Maxout. The third activation function may be set to be different from the second activation function. The third table storage circuit 135 may output a result value of the third activation function stored in a look-up table form as a third table output signal TOUT3 based on the input distribution signal IDST.

A fourth activation function may be hardwired into the fourth table storage circuit 137. The fourth table storage circuit 137 may include logic circuits implemented in hardware with the fourth activation function. The fourth activation function may be set as one of sigmoid, Tanh, ReLU, leaky ReLU, and Maxout. The fourth activation function may be set to be different from the second and third activation functions. The fourth table storage circuit 137 may output a result value of the fourth activation function stored in a look-up table form as a fourth table output signal TOUT4 based on the input distribution signal IDST.

The output distribution signal selection circuit 139 may generate the output distribution signal ODST from the first table output signal TOUT1, the second table output signal TOUT2, the third table output signal TOUT3, and the fourth table output signal TOUT4 based on the function selection signal FS. The output distribution signal selection circuit 139 may output the first table output signal TOUT1 as the output distribution signal ODST when the function selection signal FS has a first logic level combination. The output distribution signal selection circuit 139 may output the second table output signal TOUT2 as the output distribution signal ODST when the function selection signal FS has a second logic level combination. The output distribution signal selection circuit 139 may output the third table output signal TOUT3 as the output distribution signal ODST when the function selection signal FS has a third logic level combination. The output distribution signal selection circuit 139 may output the fourth table output signal TOUT4 as the output distribution signal ODST when the function selection signal FS has a fourth logic level combination.

Figure 4:
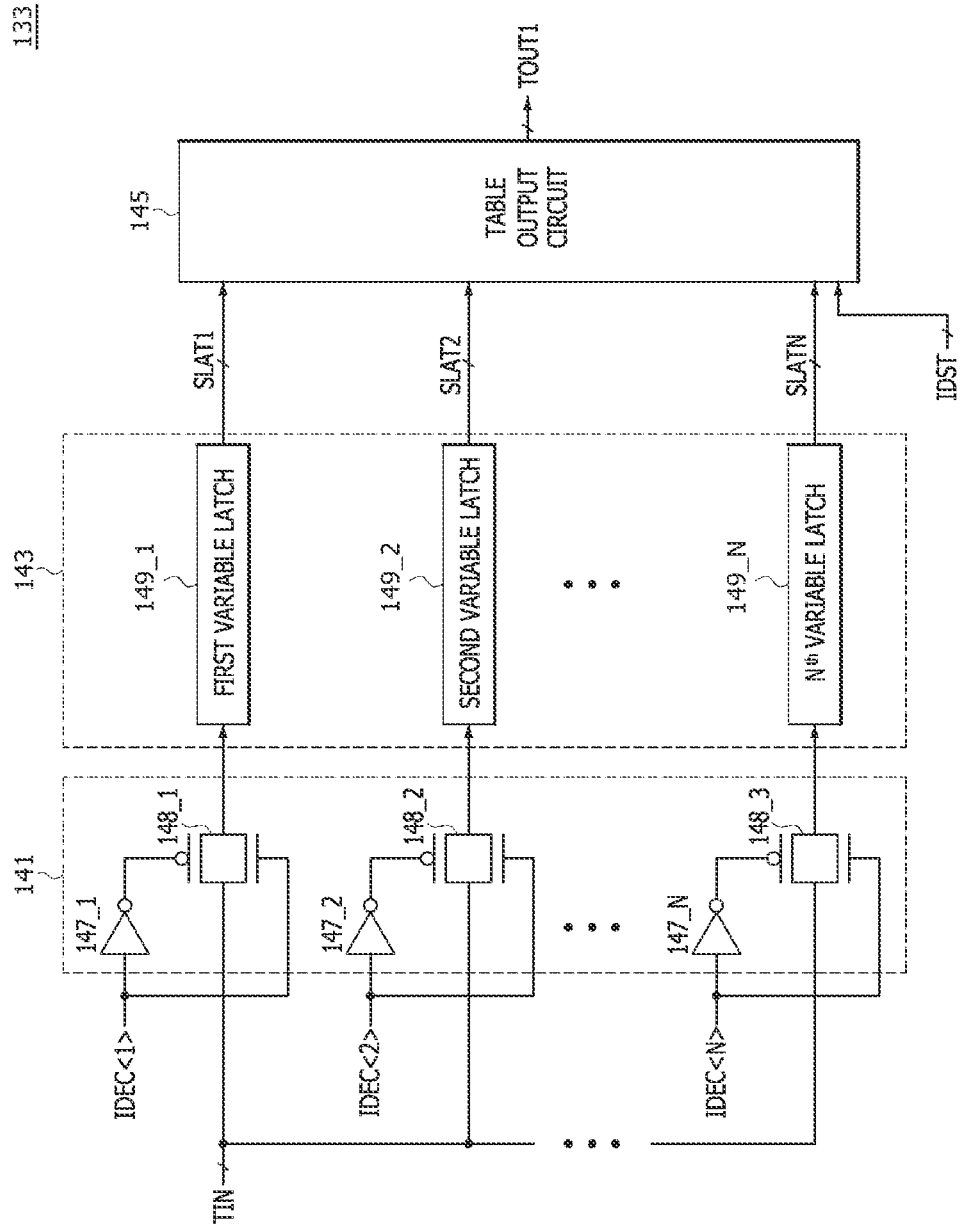
FIG. 4 illustrates a configuration of a first table storage circuit included in the AF circuit of FIG. 3.

Referring to FIG. 4, the first table storage circuit 133 may include a decoded signal input circuit 141, a variable latch circuit 143, and a table output circuit 145.

The decoded signal input circuit 141 may include inverters 147_1~147_N and transfer gates 148_1~148_N. The inverter 1471 may inversely buffer a first bit signal of the decoded input signal IDEC<1> to output the inversely buffered signal of the first bit signal of the decoded input signal IDEC<1>. The inverter 1472 may inversely buffer a second bit signal of the decoded input signal IDEC<2> to output the inversely buffered signal of the second bit signal of the decoded input signal IDEC<2>. The inverter 147_N may inversely buffer an $N^{th}$ bit signal of the decoded input signal IDEC<N> to output the inversely buffered signal of the $N^{th}$ bit signal of the decoded input signal IDEC<N>. The transfer gate 148_1 may be turned on to transfer the table input signal TIN to a first variable latch 149_1 when the first bit signal of the decoded input signal IDEC<1> has a logic "high" level. The transfer gate 148_2 may be turned on to transfer the table input signal TIN to a second variable latch 149_2 when the second bit signal of the decoded input signal IDEC<2> has a logic "high" level. The transfer gate 148_N may be turned on to transfer the table input signal TIN to an $N^{th}$ variable latch 149_N when the $N^{th}$ bit signal of the decoded input signal IDEC<N> has a logic "high" level.

The decoded signal input circuit 141 may transfer the table input signal TIN to the first to $N^{th}$ variable latches 149_1~149_N included in the variable latch circuit 143 based on the decoded input signal IDEC. The decoded signal input circuit 141 may receive the table input signal TIN through a path selected by the decoded input signal IDEC to transfer the table input signal TIN to the first to $N^{th}$ variable latches 149_1~149_N included in the variable latch circuit 143.

The variable latch circuit 143 may include the first to $N^{th}$ variable latches 149_1~149_N. The first variable latch 149_1 may receive and store the table input signal TIN through the transfer gate 148_1 turned on when the first bit signal IDEC<1> of the decoded input signal IDEC has a logic "high" level and may output the stored table input signal TIN as a first variable latch signal SLAT1. The second variable latch 149_2 may receive and store the table input signal TIN through the transfer gate 148_2 turned on when the second bit signal IDEC<2> of the decoded input signal IDEC has a logic "high" level and may output the stored table input signal TIN as a second variable latch signal SLAT2. The $N^{th}$ variable latch 149_N may receive and store the table input signal TIN through the transfer gate 148_N turned on when the $N^{th}$ bit signal IDEC<N> of the decoded input signal IDEC has a logic "high" level and may output the stored table input signal TIN as an $N^{th}$ variable latch signal SLATN.

The table output circuit 145 may select one of the first to $N^{th}$ variable latch signals SLAT1~SLATN as a result value of the activation function based on the input distribution signal IDST, thereby outputting the selected variable latch signal as the first table output signal TOUT1. The table output circuit 145 may select one of the first to $N^{th}$ variable latch signals SLAT1~SLATN as the first table output signal TOUT1 according to a logic level combination of the input distribution signal IDST or according to a decoded signal of the input distribution signal IDST. A configuration and an operation of the table output circuit 145 will be described with reference to FIGS. 5 and 6.

Figure 5:
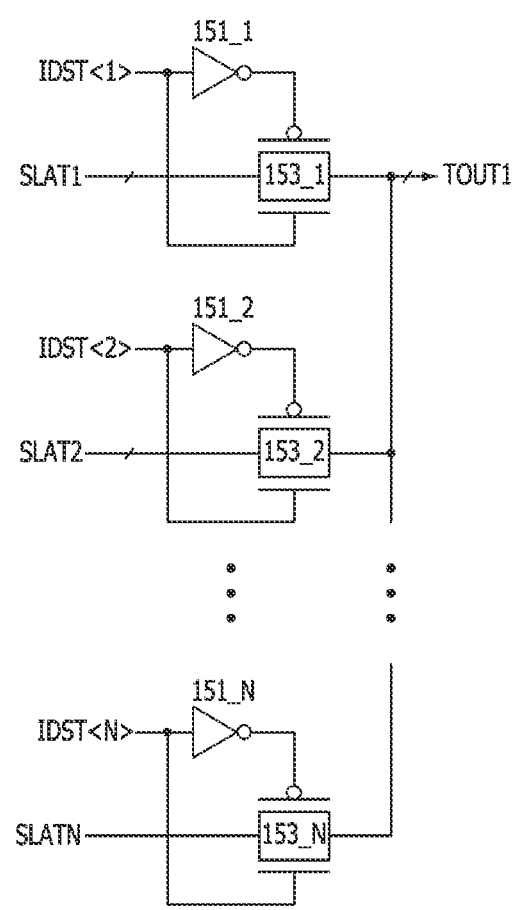
FIGS. 5 and 6 are circuit diagrams illustrating examples of a table output circuit included in the first table storage circuit of FIG. 4.

Referring to FIG. 5, a table output circuit 145*a* corresponding to an example of the table output circuit 145 may include inverters 151_1, 151_2, . . . , and 151_N and transfer gates 1531, 153_2, . . . , and 153_N. The inverter 151_1 may inversely buffer a first bit signal of the input distribution signal IDST<1> to output the inversely buffered signal of the first bit signal of the input distribution signal IDST<1>. The inverter 1512 may inversely buffer a second bit signal of the input distribution signal IDST<2> to output the inversely buffered signal of the second bit signal of the input distribution signal IDST<2>. The inverter 151_N may inversely buffer an $N^{th}$ bit signal of the input distribution signal IDST<N> to output the inversely buffered signal of the $N^{th}$ bit signal of the input distribution signal IDST<N>. The transfer gate 153_1 may be turned on to output the first variable latch signal SLAT1 as the first table output signal TOUT1 when the first bit signal of the input distribution signal IDST<1> has a logic "high" level. The transfer gate 1532 may be turned on to output the second variable latch signal SLAT2 as the first table output signal TOUT1 when the second bit signal of the input distribution signal IDST<2> has a logic "high" level. The transfer gate 153_N may be turned on to output the $N^{th}$ variable latch signal SLATN as the first table output signal TOUT1 when the $N^{th}$ bit signal of the input distribution signal IDST<N> has a logic "high" level.

Figure 6:
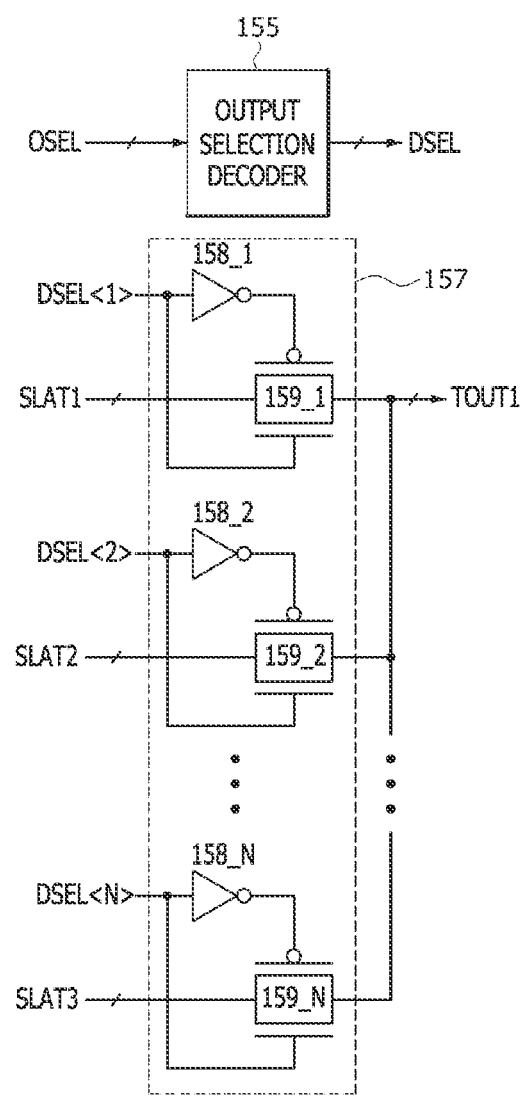

Referring to FIG. 6, a table output circuit 145*b* corresponding to another example of the table output circuit 145 may include an output selection decoder 155 and a decoded signal output circuit 157. The output selection decoder 155 may decode the input distribution signal IDST to generate a decoded selection signal DSEL. The decoded signal output circuit 157 may include inverters 158_1, 158_2, . . . , and 158_N and transfer gates 159_1, 159_2, . . . , and 159_N. The inverter 158_1 may inversely buffer a first bit signal of the decoded selection signal DSEL<1> to output the inversely buffered signal of the first bit signal of the decoded selection signal DSEL<1>. The inverter 158_2 may inversely buffer a second bit signal of the decoded selection signal DSEL<2> to output the inversely buffered signal of the second bit signal of the decoded selection signal DSEL<2>. The inverter 158_N may inversely buffer an $N^{th}$ bit signal of the decoded selection signal DSEL<N> to output the inversely buffered signal of the $N^{th}$ bit signal of the decoded selection signal DSEL<N>. The transfer gate 1591 may be turned on to output the first variable latch signal SLAT1 as the first table output signal TOUT1 when the first bit signal of the decoded selection signal DSEL<1> has a logic "high" level. The transfer gate 159_2 may be turned on to output the second variable latch signal SLAT2 as the first table output signal TOUT1 when the second bit signal of the decoded selection signal DSEL<2> has a logic "high" level. The transfer gate 159_N may be turned on to output the $N^{th}$ variable latch signal SLATN as the first table output signal TOUT1 when the $N^{th}$ bit signal of the decoded selection signal DSEL<N> has a logic "high" level.

Figure 7:
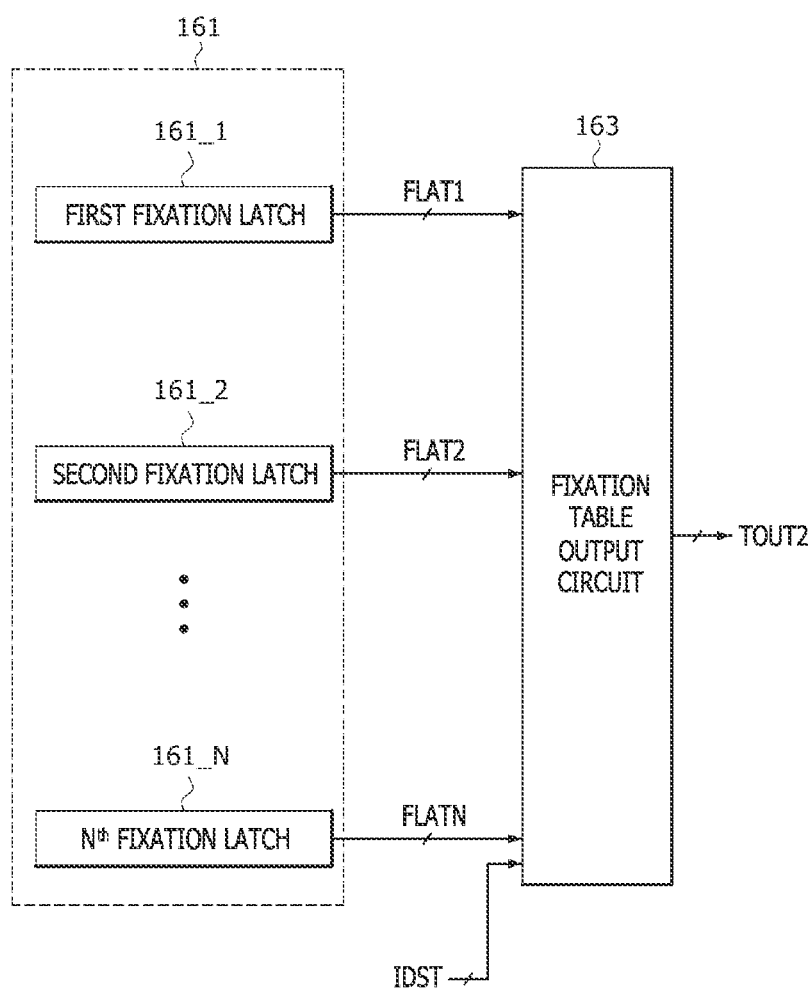
FIG. 7 is a block diagram illustrating a configuration of a second table storage circuit included in the AF circuit of FIG. 3.

Referring to FIG. 7, the second table storage circuit 134 may include a fixation latch circuit 161 and a fixation table output circuit 163. The fixation latch circuit 161 may include first to $N^{th}$ fixation latches 161_1~161_N. A first fixation latch signal FLAT1 may be hardwired in the first fixation latch 161_1 as a hardware. A second fixation latch signal FLAT2 may be hardwired in the second fixation latch 161_2 as a hardware. An $N^{th}$ fixation latch signal FLATN may be hardwired in the $N^{th}$ fixation latch 161_N as a hardware. Each of the first to $N^{th}$ fixation latch signals FLAT1~FLATN stored in the first to $N^{th}$ fixation latches 161_1~161_N may be a result value for storing one of sigmoid, Tanh, ReLU, leaky ReLU, and Maxout in a look-up table form. Logic level combinations of the input distribution signal IDST may be set to correspond to the first to $N^{th}$ fixation latch signals FLAT1~FLATN, respectively. The fixation table output circuit 163 may select one of the first to $N^{th}$ fixation latch signals FLAT1~FLATN as a result value of the activation function based on the input distribution signal IDST, thereby outputting the selected variable latch signal as the second table output signal TOUT2. Each of the third and fourth table storage circuits 25 and 26 illustrated in FIG. 3 may have the same configuration as the second table storage circuit 134 illustrated in FIG. 7.

The arithmetic device 100 with an aforementioned configuration may receive information on the activation function used for a neural network as a command and an address to store the information in a look-up table form. Thus, various activation functions set to be different from each other may be applied to the neural network without any design changes.

Figure 8:
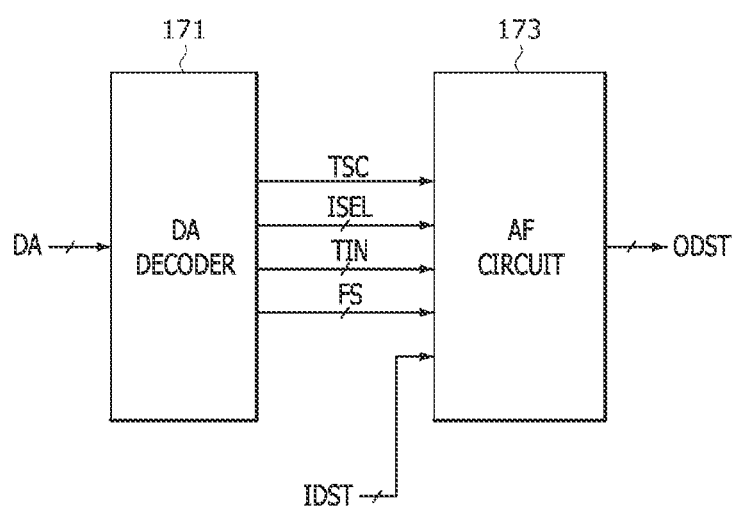
FIG. 8 is a block diagram illustrating a configuration of an arithmetic device according to another embodiment of the present disclosure.

Referring to FIG. 8, an arithmetic device 100a according to another embodiment may include an external data decoder 171 and an AF circuit 173.

The external data decoder 171 may receive external data DA to set and output a table set signal TSC, an input selection signal ISEL, a table input signal TIN, and a function selection signal FS. The external data decoder 171 may generate the table set signal TSC, the input selection signal ISEL, the table input signal TIN, and the function selection signal FS from the external data DA which are sequentially input to the external data decoder 171.

The AF circuit 173 may store activation functions used for a neural network in a look-up table form, based on the table set signal TSC, the input selection signal ISEL, and the table input signal TIN. Various activation functions may be hardwired in the AF circuit 173. The AF circuit 173 may output a result value of an activation function, which is selected by the function selection signal FS based on an input distribution signal IDST, as an output distribution signal ODST. A configuration and an operation of the AF circuit 173 may be the same as a configuration and an operation of the AF circuit 113 illustrated in FIG. 1. Thus, descriptions of the AF circuit 173 will be omitted hereinafter.

The arithmetic device 100a with the aforementioned configurations may receive information on the activation function used for a neural network as data to store the information in a look-up table form. Thus, various activation functions set to be different from each other may be applied to the neural network without any design changes.

Figure 9:
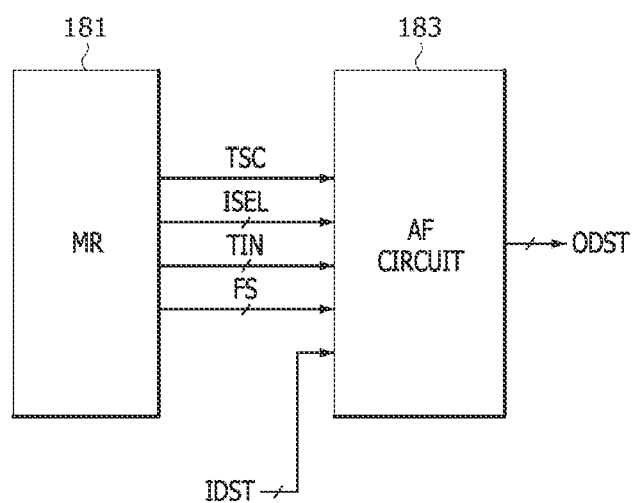
FIG. 9 is a block diagram illustrating a configuration of an arithmetic device according to still another embodiment of the present disclosure.

Referring to FIG. 9, an arithmetic device 100b according to still another embodiment may include a mode register 181 and an AF circuit 183.

The mode register 181 may store a table set signal TSC, an input selection signal ISEL, a table input signal TIN, and a function selection signal FS through a mode register set. The mode register 181 may output the table set signal TSC, the input selection signal ISEL, the table input signal TIN, and the function selection signal FS through a mode register read.

The AF circuit 183 may store activation functions used for a neural network in a look-up table form, based on the table set signal TSC, the input selection signal ISEL, and the table input signal TIN. Various activation functions may be hardwired in the AF circuit 183. The AF circuit 183 may output a result value of an activation function, which is selected by the function selection signal FS based on an input distribution signal IDST, as an output distribution signal ODST. A configuration and an operation of the AF circuit 183 may be the same as a configuration and an operation of the AF circuit 113 illustrated in FIG. 1. Thus, descriptions of the AF circuit 183 will be omitted hereinafter.

The arithmetic device 100b with the aforementioned configurations may store information on the activation function used for a neural network in a look-up table form based on information stored in the mode register 181. Thus, various activation functions set to be different from each other may be applied to the neural network without any design changes.

The arithmetic device 100 illustrated in FIG. 1, the arithmetic device 100a illustrated in FIG. 8, and the arithmetic device 100b illustrated in FIG. 9 can be included in memory modules that receive the external command through hosts and memory controllers. Memory modules can be implemented as single in-line memory module (SIMM), dual inline memory module (DIMM), and high bandwidth memory (HBM).

Figure 10:
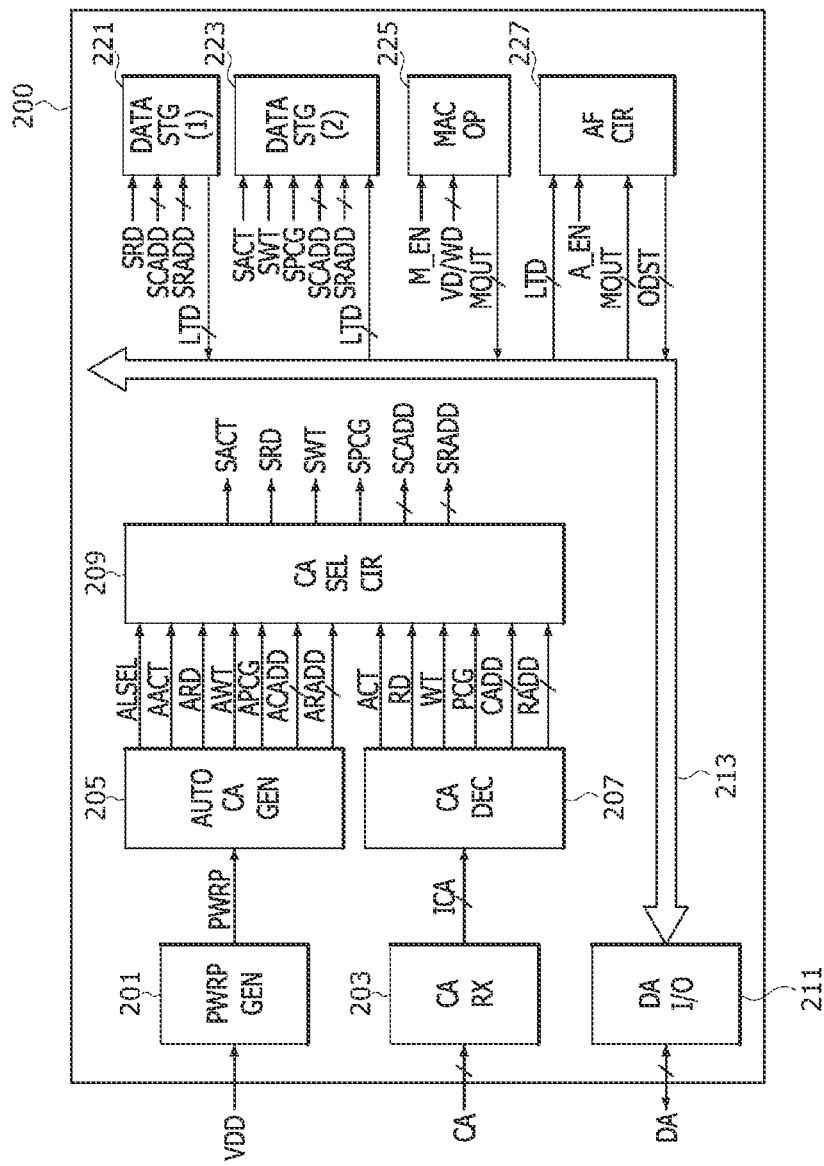
FIG. 10 is a block diagram illustrating a configuration of an arithmetic device for neural networks according to yet another embodiment of the present disclosure.

As illustrated in FIG. 10, an arithmetic device 200, according to yet another embodiment, may include a power-up pulse generation circuit (PWRP GEN) 201, a command/address reception circuit (CA RX) 203, an auto-command/address generation circuit (AUTO CA GEN) 205, a command/address decoder (CA DEC) 207, a command/address selection circuit (CA SEL CIR) 209, a data input/output (I/O) circuit (DA I/O) 211, a data line 213, a first data storage circuit (DATA STG(1)) 221, a second data storage circuit (DATA STG(2)) 223, a MAC operator (MAC OP) 225, and an activation function (AF) circuit (AF CIR) 227.

The power-up pulse generation circuit 201 may receive a power source voltage VDD from an external device that is coupled to the arithmetic device 200. The external device may include a host, a controller, a test apparatus, or the like. The power-up pulse generation circuit 201 may generate a power-up pulse PWRP, which is activated when the power source voltage VDD is boosted to a level that is the same as or higher than a target level. In the present embodiment, the power-up pulse PWRP may be activated to have a logic "high" level during a predetermined period. However, the present embodiment may be merely an example of the present disclosure. Thus, the present disclosure is not limited to the present embodiment.

The command/address reception circuit 203 may receive a command/address signal CA from the external device to perform various internal operations. The internal operations may include an auto-load operation, a normal operation, a MAC arithmetic operation, and an activation operation. The command/address signal CA may include a command and an address. The command/address reception circuit 203 may extract the command and the address from the command/address signal CA and may output the extracted command and the extracted address as an internal command/address signal ICA. The number of bits that are included in the command/address signal CA may be set to be different according to the embodiments. The number of bits that are included in the internal command/address signal ICA may also be set to be different according to the embodiments.

The auto-command/address generation circuit 205 may receive the power-up pulse PWRP from the power-up pulse generation circuit 201. The auto-command/address generation circuit 205 may output an auto-load selection signal ALSEL that is activated when the power-up pulse PWRP is activated. The auto-load selection signal ALSEL may be activated to execute the auto-load operation. The auto-load operation may include an auto-read operation that reads out look-up table data LTD, stored in the first data storage circuit 221, and an auto-write operation that writes the look-up table data LTD into the second data storage circuit 223. In the present embodiment, the auto-load selection signal ALSEL may be activated to have a logic "high" level. However, the present embodiment may be merely an example of the present disclosure. Thus, the present disclosure is not limited to the present embodiment. The auto-command/address generation circuit 205 may sequentially generate the auto-load selection signal ALSEL and an auto-load command. The auto-load command may include an auto-active signal AACT, an auto-read signal ARD, an auto-write signal AWT, and an auto-pre-charge signal APCG. The auto-command/address generation circuit 205 may sequentially generate the auto-active signal AACT, the auto-read signal ARD, the auto-write signal AWT, and the auto-pre-charge signal APCG based on the auto-load operation while the auto-load selection signal ALSEL is being activated and may output an auto-column address ACADD and an auto-row address ARADD, a logic level combination of at least one of which is changed for a next auto-load operation after the termination of the auto-load operation. In some embodiments, the auto-command/address generation circuit 205 may be configured so that the auto-active signal AACT is generated after the auto-read signal ARD is generated. The auto-read signal ARD may be activated to read out the look-up table data LTD that is stored in the first data storage circuit 221. The auto-active signal AACT, the auto-write signal AWT, and the auto-pre-charge signal APCG may be sequentially activated for the auto-write operation, including an active operation, a write operation, and a pre-charge operation, which are sequentially performed. One of the data storage units (DSUs that are included in the first data storage circuit 221 of FIG. 13), in which the look-up table data LTD that is read out during the auto-read operation is stored, may be selected by the auto-column address ACADD and the auto-row address ARADD. Some of memory cells (MCs that are included in the second data storage circuit 223 of FIG. 14), into which the look-up table data LTD are written during the auto-write operation, may also be selected by the auto-column address ACADD and the auto-row address ARADD.

The command/address decoder 207 may receive the internal command/address signal ICA from the command/address reception circuit 203. The command/address decoder 207 may decode the internal command/address signal ICA to generate an active signal ACT, a read signal RD, a write signal WT, a pre-charge signal PCG, a column address CADD, and a row address RADD, which are used for the normal operation. The normal operation may include an active operation, a read operation, a write operation, and a pre-charge operation. The active signal ACT may be activated to perform the active operation for the memory cells (MCs of FIG. 14) that are included in the second data storage circuit 223. The read signal RD may be activated to perform the read operation for the memory cells (MCs of FIG. 14) that are included in the second data storage circuit 223. The write signal WT may be activated to perform the write operation for the memory cells (MCs of FIG. 14) that are included in the second data storage circuit 223. The pre-charge signal PCG may be activated to perform the pre-charge operation for the memory cells (MCs of FIG. 14) that are included in the second data storage circuit 223. At least one of the memory cells (MCs of FIG. 14) that are included in the second data storage circuit 223 may be selected by a logic level combination of the column address CADD and the row address RADD.

The command/address selection circuit 209 may receive the auto-load selection signal ALSEL, the auto-active signal AACT, the auto-read signal ARD, the auto-write signal AWT, the auto-pre-charge signal APCG, the auto-column address ACADD, and the auto-row address ARADD from the auto-command/address generation circuit 205 and may receive the active signal ACT, the read signal RD, the write signal WT, the pre-charge signal PCG, the column address CADD, and the row address RADD from the command/address decoder 207. The command/address selection circuit 209 may generate a selection active signal SACT, a selection read signal SRD, a selection write signal SWT, a selection pre-charge signal SPCG, a selection column address SCADD, and a selection row address SRADD based on the auto-active signal AACT, the auto-read signal ARD, the auto-write signal AWT, the auto-pre-charge signal APCG, the auto-column address ACADD, the auto-row address ARADD, the active signal ACT, the read signal RD, the write signal WT, the pre-charge signal PCG, the column address CADD, and the row address RADD based on the auto-load selection signal ALSEL. The command/address selection circuit 209 may select and output the auto-active signal AACT as the selection active signal SACT when the auto-load selection signal ALSEL is activated for the auto-load operation and may select and output the active signal ACT as the selection active signal SACT when the auto-load selection signal ALSEL is deactivated for the normal operation. The command/address selection circuit 209 may select and output the auto-read signal ARD as the selection read signal SRD when the auto-load selection signal ALSEL is activated for the auto-load operation and may select and output the read signal RD as the selection read signal SRD when the auto-load selection signal ALSEL is deactivated for the normal operation. The command/address selection circuit 209 may select and output the auto-write signal AWT as the selection write signal SWT when the auto-load selection signal ALSEL is activated for the auto-load operation and may select and output the write signal WT as the selection write signal SWT when the auto-load selection signal ALSEL is deactivated for the normal operation. The command/address selection circuit 209 may select and output the auto-pre-charge signal APCG as the selection pre-charge signal SPCG when the auto-load selection signal ALSEL is activated for the auto-load operation and may select and output the pre-charge signal PCG as the selection pre-charge signal SPCG when the auto-load selection signal ALSEL is deactivated for the normal operation. The command/address selection circuit 209 may select and output the auto-column address ACADD as the selection column address SCADD when the auto-load selection signal ALSEL is activated for the auto-load operation and may select and output the column address CADD as the selection column address SCADD when the auto-load selection signal ALSEL is deactivated for the normal operation. The command/address selection circuit 209 may select and output the auto-row address ARADD as the selection row address SRADD when the auto-load selection signal ALSEL is activated for the auto-load operation and may select and output the row address RADD as the selection row address SRADD when the auto-load selection signal ALSEL is deactivated for the normal operation.

The data I/O circuit 211 may receive external data DA from the externa device and may transmit the external data DA to at least one of the first data storage circuit 221, the second data storage circuit 223, the MAC operator 225, and the AF circuit 227 through the data line 213. The data I/O circuit 211 may output the data, which is output from at least one of the first data storage circuit 221, the second data storage circuit 223, the MAC operator 225, and the AF circuit 227, through the data line 213, as the external data DA. The data I/O circuit 211 may include a data I/O buffer receiving or outputting the external data DA, a data input driver, a data output driver, and a deserializer.

The first data storage circuit 221 may receive the selection read signal SRD, the selection column address SCADD, and the selection row address SRADD from the command/address selection circuit 209. The first data storage circuit 221 may include the plurality of data storage units (DSUs of FIG. 13). The first data storage circuit 221 may include an array of e-fuses. Various activation functions may be stored in the data storage units (DSUs of FIG. 13) as look-up table data (LTD) and in hardware. When the selection read signal SRD is activated, the first data storage circuit 221 may output the look-up table data LTD, which are stored in the data storage units (DSUs of FIG. 13), accessed by the selection column address SCADD and the selection row address SRADD, through the data line 213 for the auto-read operation. In some embodiment, when the selection read signal SRD is activated, the first data storage circuit 221 may sequentially output multiple sets of the look-up table data LTD that correspond to the respective activation functions, regardless of the selection column address SCADD and the selection row address SRADD.

The second data storage circuit 223 may receive the selection active signal SACT, the selection write signal SWT, the selection pre-charge signal SPCG, the selection column address SCADD, and the selection row address SRADD from the command/address selection circuit 209. The second data storage circuit 223 may include the plurality of memory cells (MCs of FIG. 13). The memory cells MCs that are included in the second data storage circuit 223 may operate in parallel in an interleaving way. The number of the memory cells that are included in the second data storage circuit 223 may be set to be different according to the embodiments. Each of the memory cells that is included in the second data storage circuit 223 may be coupled to one of a plurality of word lines and one of a plurality of bit lines. One of the plurality of word lines may be selected by the selection row address SRADD, and at least one of the plurality of bit lines may be selected by the selection column address SCADD.

The second data storage circuit 223 may perform the auto-write operation that stores the look-up table data LTD, which is output from the first data storage circuit 221, into the second data storage circuit 223 based on the selection active signal SACT, the selection write signal SWT, the selection pre-charge signal SPCG, the selection column address SCADD, and the selection row address SRADD. When the selection active signal SACT is activated, the second data storage circuit 223 may perform the active operation for the memory cells that are accessed by the selection column address SCADD and the selection row address SRADD. When the selection write signal SWT is activated, the second data storage circuit 223 may perform the write operation for the memory cells that are accessed by the selection column address SCADD and the selection row address SRADD. The second data storage circuit 223 may perform the pre-charge operation for the memory cells that are accessed by the selection column address SCADD and the selection row address SRADD when the selection pre-charge signal SPCG is activated.

The MAC operator 225 may receive at least one of vector data VD and weight data WD from the second data storage circuit 223. The MAC operator 225 may receive at least one of the vector data VD and the weight data WD from the data I/O circuit 211. The MAC operator 225 may perform the MAC arithmetic operation of the vector data VD and the weight data WD based on an arithmetic control signal M_EN, thereby generating an arithmetic result signal MOUT. The MAC operator 225 may perform a multiplying operation and an accumulating operation of the vector data VD and the weight data WD during the MAC arithmetic operation to generate the arithmetic result signal MOUT. The MAC operator 225 may receive an output distribution signal ODST that is output from the AF circuit 227 as the vector data VD when multiple layers are applied in perceptron. The arithmetic control signal M_EN may be generated by the command/address decoder 207.

The AF circuit 227 may receive the arithmetic result signal MOUT that is output from the MAC operator 225 by the MAC arithmetic operation. The AF circuit 227 may perform the activation operation based on an activation control signal A_EN to generate the output distribution signal ODST based on the arithmetic result signal MOUT. The AF circuit 227 may receive the look-up table data LTD from the first data storage circuit 221 or the second data storage circuit 223 and may store the look-up table data LTD therein. When the activation operation is performed, the AF circuit 227 may select and output the output distribution signal ODST based on the arithmetic result signal MOUT and the look-up table data LTD, the look-up table data LTD corresponding to the activation function. The AF circuit 227 may output the output distribution signal ODST to the data line 213. The output distribution signal ODST loaded on the data line 213 may be output as the external data DA through the data I/O circuit 211. In some embodiments, the arithmetic device 200 may be configured so that the output distribution signal ODST is transmitted to and stored in the second data storage circuit 223 or is transmitted to the MAC operator 225.

Figure 11:
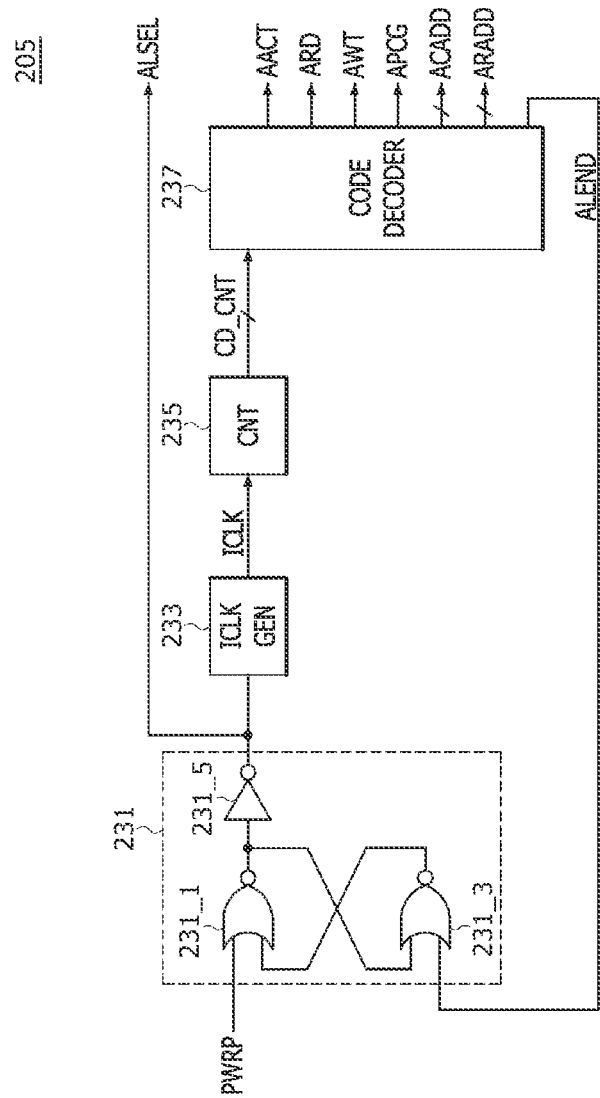
FIG. 11 illustrates a configuration of an auto-command/address generation circuit included in the arithmetic device illustrated in FIG. 10.

Referring to FIG. 11, the auto-command/address generation circuit 205 may include an auto-load selection signal latch circuit 231, an internal clock generation circuit (ICLK GEN) 233, a counter (CNT) 235, and a code decoder 237.

The auto-load selection signal latch circuit 231 may receive the power-up pulse PWRP from the power-up pulse generation circuit 201 and may receive an auto-load end signal ALEND from the code decoder 237. The auto-load selection signal latch circuit 231 may include NOR gates 231_1 and 231_3 and an inverter 231_5. The NOR gate 2311 may receive the power-up pulse PWRP and an output signal of the NOR gate 231_3 to perform a logical NOR operation of the power-up pulse PWRP and the output signal of the NOR gate 231_3. The NOR gate 231_3 may receive the auto-load end signal ALEND and an output signal of the NOR gate 231_1 to perform a logical NOR operation of the auto-load end signal ALEND and the output signal of the NOR gate 231_1. The inverter 231_5 may inversely buffer the output signal of the NOR gate 231_1 to output the inversely buffered signal of the output signal of the NOR gate 231_1 as the auto-load selection signal ALSEL. The auto-load selection signal latch circuit 231 may activate the auto-load selection signal ALSEL to a logic "high" level when the power-up pulse PWRP is activated to have a logic "high" level. The auto-load selection signal latch circuit 231 may deactivate the auto-load selection signal ALSEL to a logic "low" level when the auto-load end signal ALEND is activated to have a logic "high" level for the termination of the auto-load operation.

The internal clock generation circuit 233 may receive the auto-load selection signal ALSEL from the auto-load selection signal latch circuit 231. The internal clock generation circuit 233 may generate an internal clock signal ICLK, a level of which is toggled, when the auto-load selection signal ALSEL is activated to have a logic "high" level. The internal clock generation circuit 233 may interrupt generation of the internal clock signal ICLK to generate the internal clock signal ICLK that maintains a predetermined logic level when the auto-load selection signal ALSEL is deactivated to have a logic "low" level.

The counter 235 may receive the internal clock signal ICLK from the internal clock generation circuit 233. The counter 235 may generate a counted code CD_CNT based on the internal clock signal ICLK. The counter 235 may count the internal clock signal ICLK, a level of which is toggled, to generate the counted code CD_CNT, the logic level combination of which sequentially changes. The number of bits that are included in the counted code CD_CNT may be set to be different according to the embodiments. For example, when the counted code CD_CNT has three bits and an initialized state of '000', the counter 235 may generate the counted code CD_CNT, the logic level combination of which is sequentially and iteratively changed in order of '001', '010', '011', '100', '101', '110', '111', and '000' whenever a level of the internal clock signal ICLK is toggled.

The code decoder 237 may receive the counted code CD_CNT from the counter 235. The code decoder 237 may sequentially activate the auto-active signal AACT, the auto-read signal ARD, the auto-write signal AWT, and the auto-pre-charge signal APCG based on the counted code CD_CNT. The code decoder 237 may sequentially activate the auto-active signal AACT, the auto-read signal ARD, the auto-write signal AWT, and the auto-pre-charge signal APCG for each auto-load operation to perform the auto-load operation, including the auto-read operation and the auto-write operation. The code decoder 237 may change a logic level combination of at least one of the auto-column address ACADD and the auto-row address ARADD for a next auto-load operation after a current auto-load operation is performed for the memory cells that are selected by the auto-column address ACADD and the auto-row address ARADD. The code decoder 237 may generate the auto-load end signal ALEND, which is activated to terminate the auto-load operation, when the auto-column address ACADD and the auto-row address ARADD are set to have predetermined logic level combinations. The code decoder 237 may generate the auto-load end signal ALEND, which is activated to have a logic "high" level, when the auto-load operations for all of the activation functions terminate.

Figure 12:
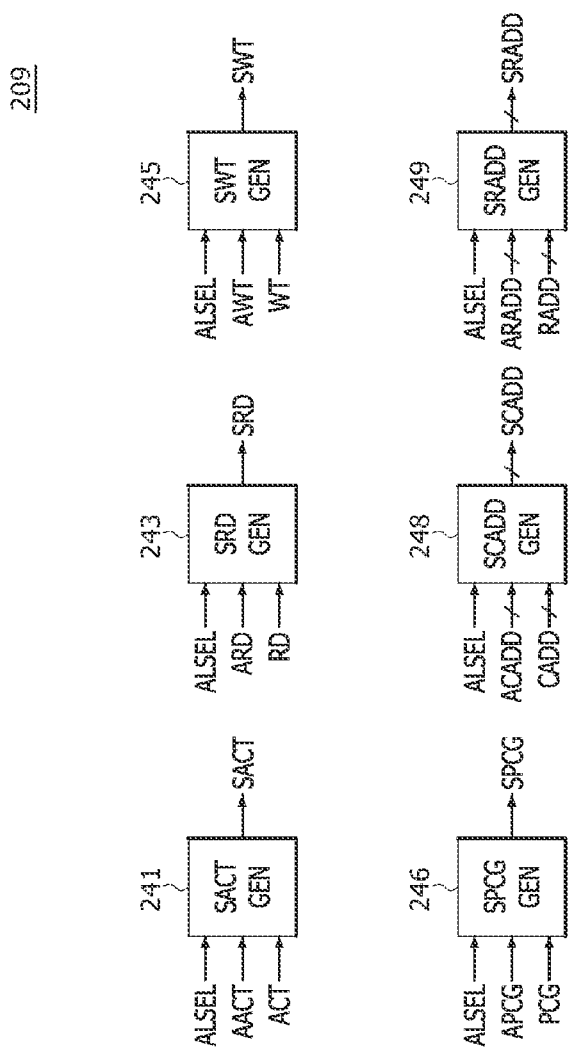
FIG. 12 is a block diagram illustrating a configuration of a command/address selection circuit included in the arithmetic device illustrated in FIG. 10.

Referring to FIG. 12, the command/address selection circuit 209 may include a selection active signal generation circuit (SACT GEN) 241, a selection read signal generation circuit (SRD GEN) 243, a selection write signal generation circuit (SWT GEN) 245, a selection pre-charge signal generation circuit (SPCG GEN) 246, a selection column address generation circuit (SCADD GEN) 248, and a selection row address generation circuit (SRADD GEN) 249.

The selection active signal generation circuit 241 may generate the selection active signal SACT based on the auto-active signal AACT or the active signal ACT based on the auto-load selection signal ALSEL. The selection active signal generation circuit 241 may select and output the auto-active signal AACT as the selection active signal SACT when the auto-load selection signal ALSEL is activated for the auto-load operation and may select and output the active signal ACT as the selection active signal SACT when the auto-load selection signal ALSEL is deactivated for the normal operation.

The selection read signal generation circuit 243 may generate the selection read signal SRD based on the auto-read signal ARD or the read signal RD based on the auto-load selection signal ALSEL. The selection read signal generation circuit 243 may select and output the auto-read signal ARD as the selection read signal SRD when the auto-load selection signal ALSEL is activated for the auto-load operation and may select and output the read signal RD as the selection read signal SRD when the auto-load selection signal ALSEL is deactivated for the normal operation.

The selection write signal generation circuit 245 may generate the selection write signal SWT based on the auto-write signal AWT or the write signal WT based on the auto-load selection signal ALSEL. The selection write signal generation circuit 245 may select and output the auto-write signal AWT as the selection write signal SWT when the auto-load selection signal ALSEL is activated for the auto-load operation and may select and output the write signal WT as the selection write signal SWT when the auto-load selection signal ALSEL is deactivated for the normal operation.

The selection pre-charge signal generation circuit 246 may generate the selection pre-charge signal SPCG based on the auto-pre-charge signal APCG or the pre-charge signal PCG based on the auto-load selection signal ALSEL. The selection pre-charge signal generation circuit 246 may select and output the auto-pre-charge signal APCG as the selection pre-charge signal SPCG when the auto-load selection signal ALSEL is activated for the auto-load operation and may select and output the pre-charge signal PCG as the selection pre-charge signal SPCG when the auto-load selection signal ALSEL is deactivated for the normal operation.

The selection column address generation circuit 248 may generate the selection column address SCADD based on the auto-column address ACADD or the column address CADD based on the auto-load selection signal ALSEL. The selection column address generation circuit 248 may select and output the auto-column address ACADD as the selection column address SCADD when the auto-load selection signal ALSEL is activated for the auto-load operation and may select and output the column address CADD as the selection column address SCADD when the auto-load selection signal ALSEL is deactivated for the normal operation.

The selection row address generation circuit 249 may generate the selection row address SRADD based on the auto-row address ARADD or the row address RADD based on the auto-load selection signal ALSEL. The selection row address generation circuit 249 may select and output the auto-row address ARADD as the selection row address SRADD when the auto-load selection signal ALSEL is activated for the auto-load operation and may select and output the row address RADD as the selection row address SRADD when the auto-load selection signal ALSEL is deactivated for the normal operation.

Figure 13:
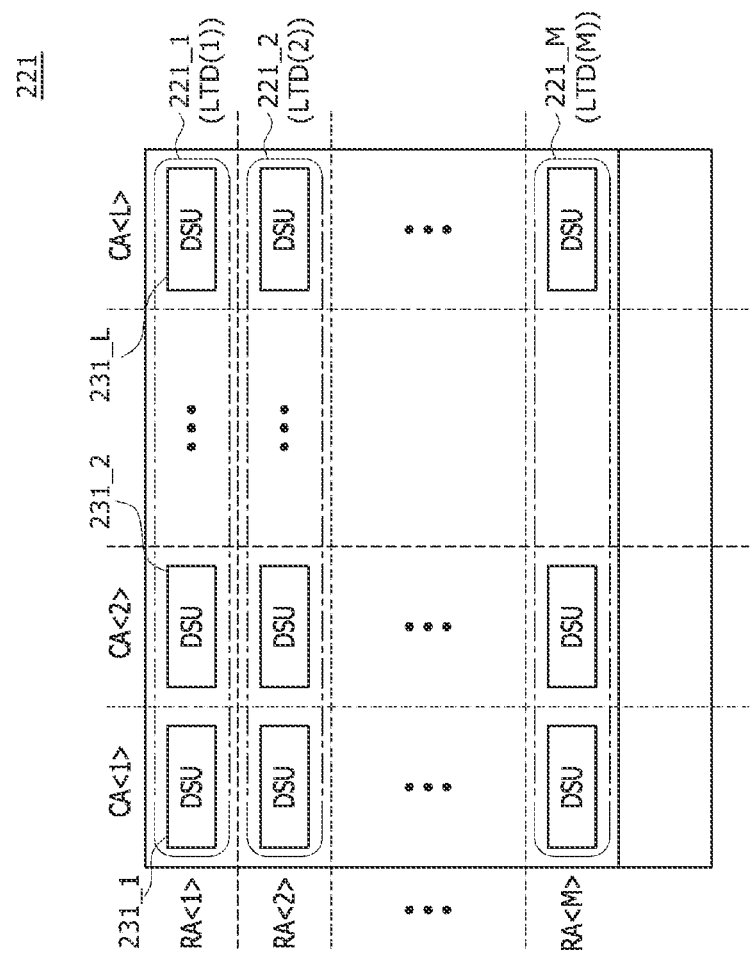
FIG. 13 illustrates a configuration of a first data storage circuit included in the arithmetic device illustrated in FIG. 10.

As illustrated in FIG. 13, the first data storage circuit 221 may include first to $M^{th}$ data storage groups 221_1~221_M.

Each of the first to $M^{th}$ data storage groups 221_1~221_M may include the plurality of data storage units DSUs (e.g., first to $L^{th}$ data storage units 231_1, 231_2, . . . , and 231_L), which are accessed by the selection column address SCADD and the selection row address SRADD. The first data storage unit 231_1 may be accessed by the selection column address SCADD with a first column address combination CA<1> and the selection row address SRADD with a first row address combination RA<1>, the second data storage unit 231_2 may be accessed by the selection column address SCADD with a second column address combination CA<2> and the selection row address SRADD with the first row address combination RA<1>, and the $L^{th}$ data storage unit 231_L may be accessed by the selection column address SCADD with an $L^{th}$ column address combination CA<L> and the selection row address SRADD with the first row address combination RA<1>. The first data storage group 2211 may include the first to $L^{th}$ data storage units 231_1, 231_2, . . . , and 231_L, which are accessed by the selection column address SCADD with the first to $L^{th}$ column address combinations CA<1:L> and the selection row address SRADD with the first row address combination RA<1>. A first look-up table data LTD(1) that is based on a first activation function may be stored in the first data storage group 2211 in hardware. Similarly, second to $M^{th}$ look-up table data LTD(2)~LTD(M) based on second to $M^{th}$ activation functions may be stored in the second to $M^{th}$ data storage groups 221_2~221_M in hardware, respectively. The first to $M^{th}$ look-up table data LTD(1)~LTD(M), stored in respective first to $M^{th}$ data storage groups 221_1~221_M, may be sequentially output during the auto-load operation which is performed based on the selection read signal SRD, the selection column address SCADD, and the selection row address SRADD. Each of the first to $M^{th}$ activation functions may be any one of sigmoid (i.e., sigmoid function), Tanh (i.e., hyperbolic tangent activation function), ReLU (i.e., rectified linear unit function), leaky ReLU (i.e., leaky rectified linear unit function), and Maxout (i.e., max out activation function).

Figure 14:
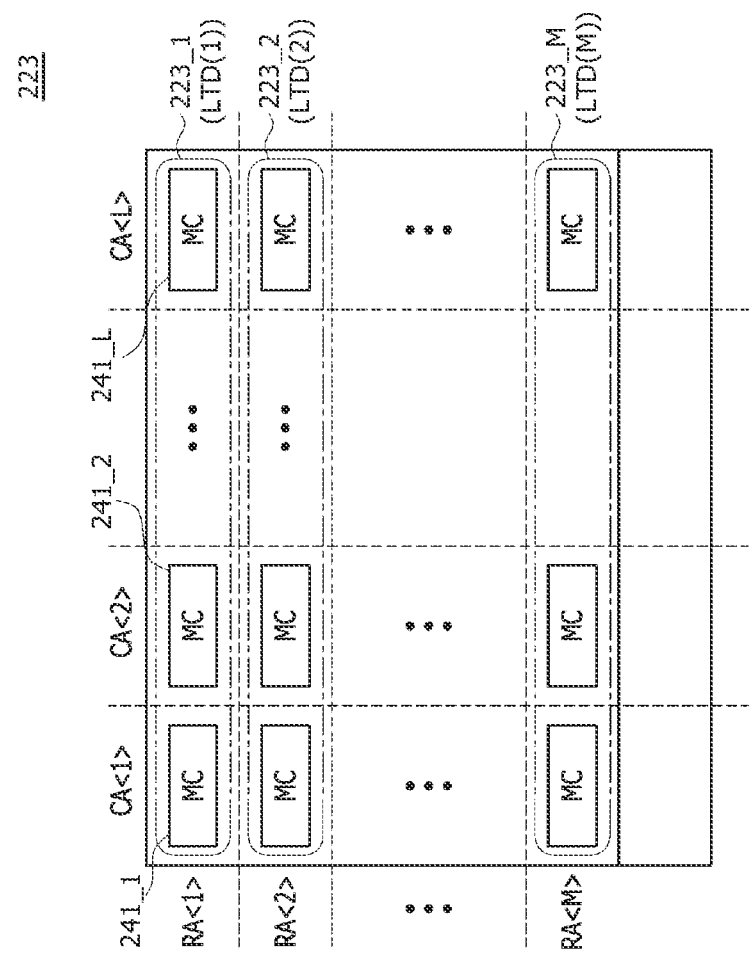
FIG. 14 illustrates a configuration of a second data storage circuit included in the arithmetic device illustrated in FIG. 10.

As illustrated in FIG. 14, the second data storage circuit 223 may include first to $M^{th}$ memory cell arrays 223_1~223_M. Each of the first to $M^{th}$ memory cell arrays 223_1~223_M may include a plurality of memory cells MCs (e.g., first to $L^{th}$ memory cells 241_1, 241_2, . . . , and 241_L), which are accessed by the selection column address SCADD and the selection row address SRADD. The first memory cell 241_1 may be accessed by the selection column address SCADD with the first column address combination CA<1> and the selection row address SRADD with the first row address combination RA<1>, the second memory cell 241_2 may be accessed by the selection column address SCADD with the second column address combination CA<2> and the selection row address SRADD with the first row address combination RA<1>, and the $L^{th}$ memory cell 241_L may be accessed by the selection column address SCADD with the $L^{th}$ column address combination CA<L> and the selection row address SRADD with the first row address combination RA<1>. The first memory cell array 223_1 may include the first to $L^{th}$ memory cells 241_1~241_L, which are accessed by the selection column address SCADD with the first to $L^{th}$ column address combinations CA<1: L> and the selection row address SRADD with the first row address combination RA<1>. The first look-up table data LTD(1) that is read out of the first data storage group 2211 by the auto-read operation may be written into the first memory cell array 2231 by the auto-write operation that is performed based on the selection active signal SACT, the selection write signal SWT, the selection pre-charge signal SPCG, the selection column address SCADD, and the selection row address SRADD. Similarly, the second to $M^{th}$ look-up table data LTD(2)~LTD (M) that are read out of the second to $M^{th}$ data storage groups 221_2~221_M by the auto-read operation may be written into respective second to $M^{th}$ memory cell arrays 223_2~223_M by the auto-write operation, which is performed based on the selection active signal SACT, the selection write signal SWT, the selection pre-charge signal SPCG, the selection column address SCADD, and the selection row address SRADD.

The auto-load operation of the arithmetic device 200 with the aforementioned configuration will be described hereinafter with reference to FIGS. 15 to 18 in conjunction with the auto-read operation to read out the first to $M^{th}$ look-up table data LTD(1)~LTD(M) from the first to $M^{th}$ data storage groups 221_1~221_M that are included in the first data storage circuit 221 illustrated in FIG. 13 and in conjunction with the auto-write operation to write the first to $M^{th}$ look-up table data LTD(1)~LTD(M) into the first to $M^{th}$ memory cell arrays 223_1~223_M that are included in the second data storage circuit 223, illustrated in FIG. 14.

Figure 15:
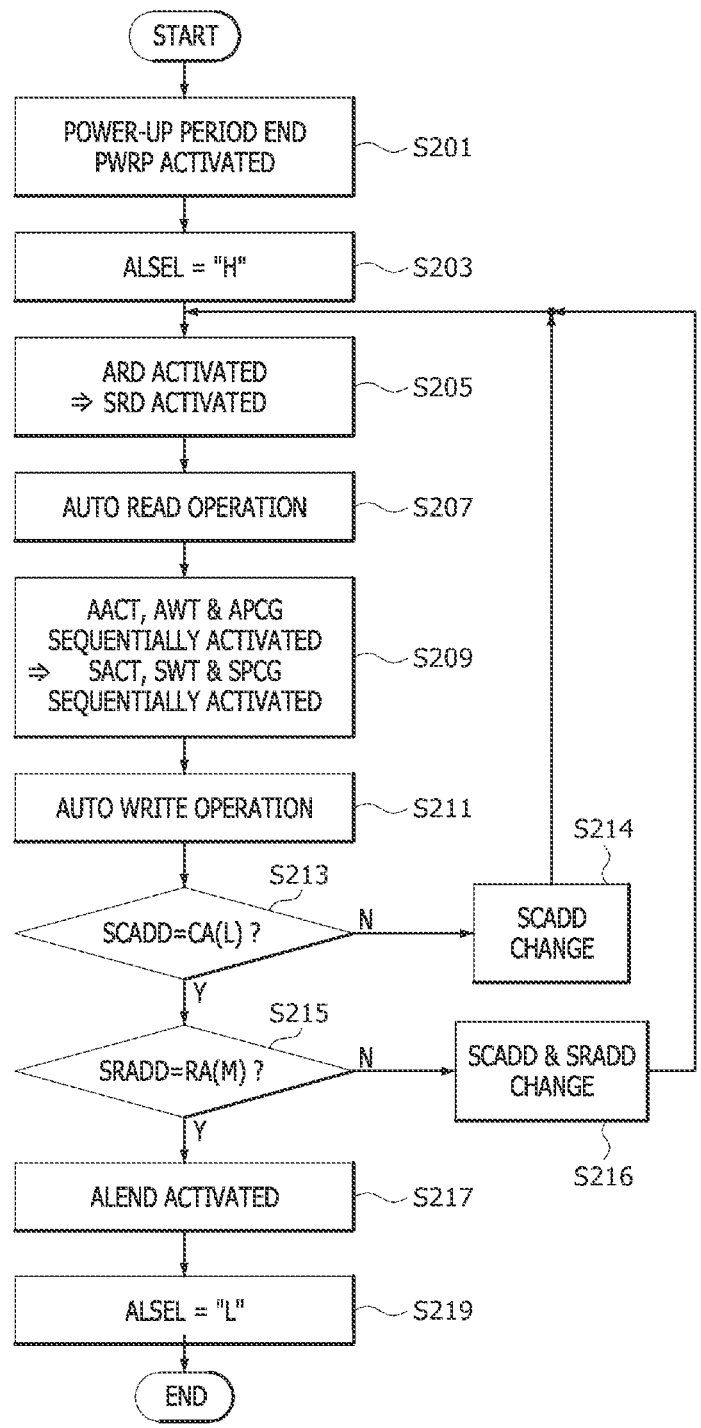
FIGS. 15 to 18 illustrate an operation of the arithmetic device illustrated in FIGS. 10 to 14.
Figure 16:
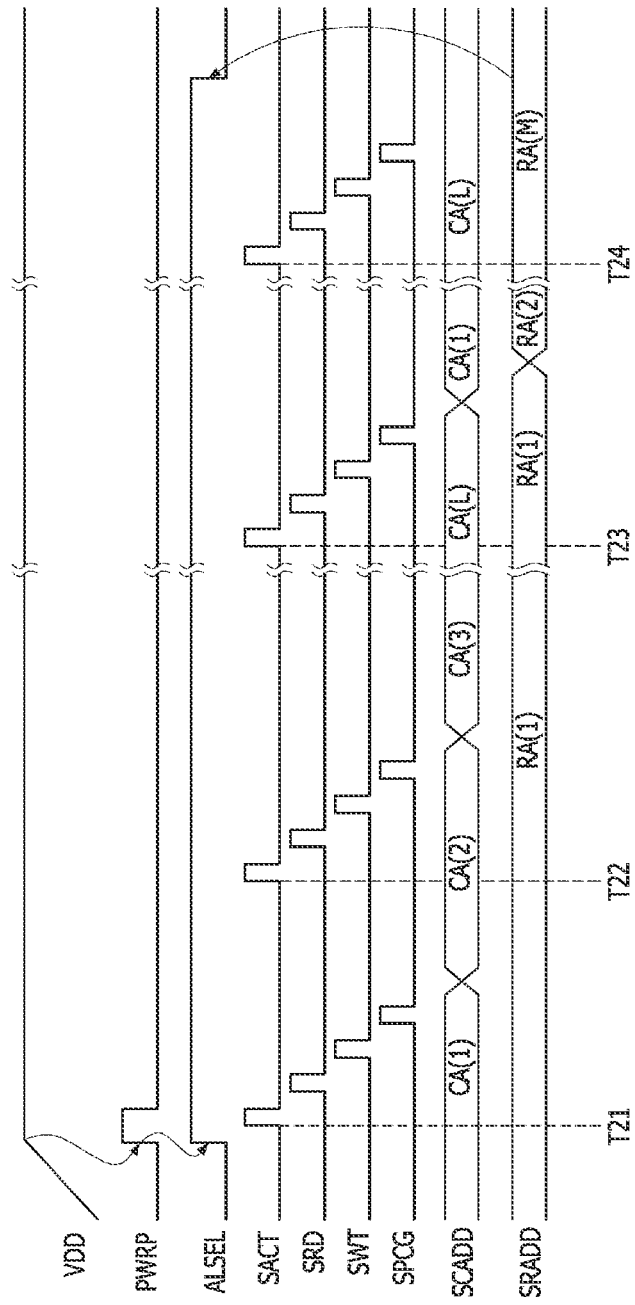
Figure 17:
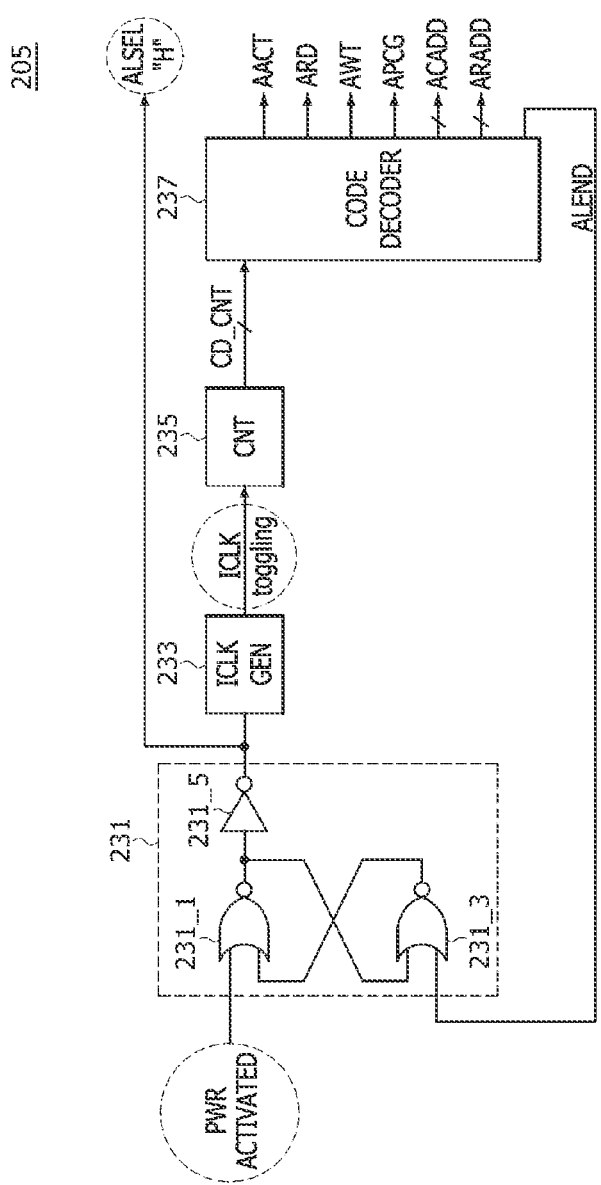

As illustrated in FIGS. 15 and 16, when the power source voltage VDD is boosted to a predetermined target level or over the predetermined target level to end the power-up period, the power-up pulse PWRP may be activated to have a logic "high(H)" level (see a step S201) and the auto-load selection signal ALSEL may be activated to have a logic "high(H)" level by the activated power-up pulse PWRP (see a step S203). As illustrated in FIG. 17, when the auto-load selection signal ALSEL is activated, the internal clock signal ICLK, the level of which is toggled, may be generated and a logic level combination of the counted code CD_CNT may be sequentially changed through a counting operation for the internal clock signal ICLK whenever the internal clock signal ICLK is toggled. The auto-active signal AACT, the auto-read signal ARD, the auto-write signal AWT, and the auto-pre-charge signal APCG may be sequentially activated by the counted code CD_CNT, the logic level combination of which varies.

As illustrated in FIGS. 15 and 16, when the auto-read signal ARD is activated, while the selection column address SCADD that is generated based on the auto-column address ACADD has the first column address combination CA<1> and the selection row address SRADD that is generated based on the auto-row address ARADD has the first row address combination RA<1>, between time "T21" and time "T22", the selection read signal SRD may be activated (see a step S205) to perform the auto-read operation (see a step S207). Between two time points may be defined as between and at the two time points. The auto-read operation may be performed in a way that reads out the data that is stored in the first data storage unit 231_1 that is included in the first data storage circuit 221, which is accessed by the selection column address SCADD with the first column address combination CA<1> and the selection row address SRADD with the first row address combination RA<1>.

As illustrated in FIGS. 15 and 16, when the auto-active signal AACT, the auto-write signal AWT, and the auto-pre-charge signal APCG are sequentially activated between time "T21" and time "T22", the selection active signal SACT, the selection write signal SWT, and the selection pre-charge signal SPCG may be sequentially activated (see a step S209) to perform the auto-write operation (see a step S211). The auto-write operation may be performed in a way that writes the data that is read out of the first data storage unit 231_1 into the first memory cell 241_1 that is included in the second data storage circuit 223, which is accessed by the selection column address SCADD with the first column address combination CA<1> and the selection row address SRADD with the first row address combination RA<1>.

As illustrated in FIGS. 15 and 16, when the auto-write operation terminates between time "T21" and time "T22", a logic level combination of the selection column address SCADD may change from the first column address combination CA<1> to the second column address combination CA<2> (see a step S214) because a logic level combination of the selection column address SCADD is not the $L^{th}$ column address combination CA<L> (see a step S213).

As illustrated in FIGS. 15 and 16, between time "T22" and time "T23", the auto-read operation may be performed to read out the data that is stored in the second data storage unit 231_2 that is included in the first data storage circuit 221, which is accessed by the selection column address SCADD with the second column address combination CA<2> and the selection row address SRADD with the first row address combination RA<1> (see the steps S205 and S207). In addition, between time "T22" and time "T23", the auto-write operation may also be performed to write the data that is read out of the second data storage unit 231_2 into the second memory cell 241_2 that is included in the second data storage circuit 223, which is accessed by the selection column address SCADD with the second column address combination CA<2> and the selection row address SRADD with the first row address combination RA<1> (see the steps S209 and S211). When the auto-write operation terminates between time "T22" and time "T23", a logic level combination of the selection column address SCADD may change from the second column address combination CA<2> to the third column address combination CA<3> (see the step S214) because a logic level combination of the selection column address SCADD is not the $L^{th}$ column address combination CA<L> (see the step S213).

As illustrated in FIGS. 15 and 16, between time "T23" and time "T24", the auto-read operation may be performed to read out the data that is stored in the $L^{th}$ data storage unit 231_L that is included in the first data storage circuit 221, which is accessed by the selection column address SCADD with the $L^{th}$ column address combination CA<L> and the selection row address SRADD with the first row address combination RA<1> (see the steps S205 and S207). In addition, between time "T23" and time "T24", the auto-write operation may also be performed to write the data that is read out of the $L^{th}$ data storage unit 231_L into the $L^{th}$ memory cell 241_L that is included in the second data storage circuit 223, which is accessed by the selection column address SCADD with the $L^{th}$ column address combination CA<L> and the selection row address SRADD with the first row address combination RA<1> (see the steps S209 and S211).

As illustrated in FIGS. 15 and 16, when the auto-read operation and the auto-write operation are performed 'L' times, respectively, between time "T21" and time "T24", the first look-up table data LTD(1) that corresponds to the first activation function may be read out of the first data storage group 221_1 and may be written into the first memory cell array 223_1 to terminate the auto-load operation. When the auto-load operation for the first activation function terminates, logic level combinations of the selection column address SCADD and the selection row address SRADD may be changed to perform the auto-load operation for the second activation function. More specifically, when a logic level combination of the selection row address SRADD is inconsistent with an $M^{th}$ row address combination RA<M> (see a step S215), the logic level combination of the selection column address SCADD may change from the $L^{th}$ column address combination CA<L> to the first column address combination CA<1> and the logic level combination of the selection row address SRADD may change from the first row address combination RA<1> to the second row address combination RA<2> (see a step S216).

Figure 18:
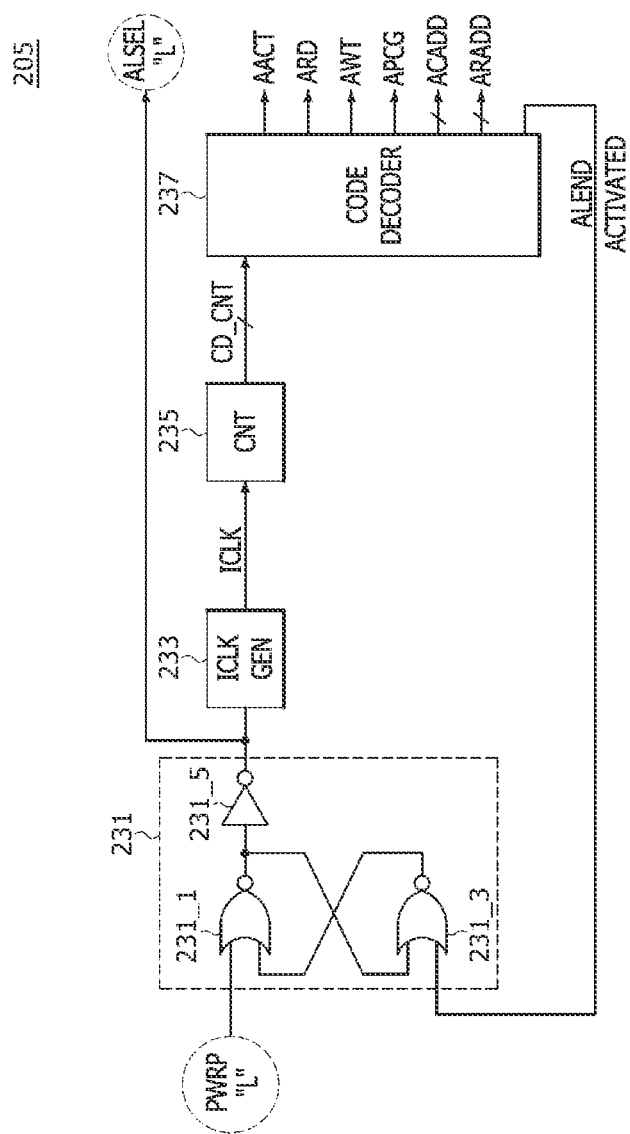

As illustrated in FIGS. 15 and 16, when all of the auto-load operations for the second to $M^{th}$ activation functions terminate after time "T24", the auto-load end signal ALEND may be activated (see a step S217) because the selection row address SRADD has a logic level combination of the $M^{th}$ row address combination RA<M> and the auto-load selection signal ALSEL may be deactivated to have a logic "low(L)" level to terminate the auto-load operation (see a step S219). As illustrated in FIG. 18, when the auto-load end signal ALEND is activated, the auto-load selection signal ALSEL may be deactivated to have a logic "low(L)" level and an operation of generating the internal clock signal ICLK, level of which is toggled, may be interrupted by the auto-load selection signal ALSEL which is deactivated.

As described above, the arithmetic device 200, according to the present embodiment, may read out the activation functions that are stored in hardware in the first data storage circuit 221 to perform the auto-load operation to write the activation functions into the second data storage circuit 223. Thus, it may be possible to more readily load the activation functions that are used for the activation operation into the second data storage circuit 223 as look-up table data.

Figure 19:
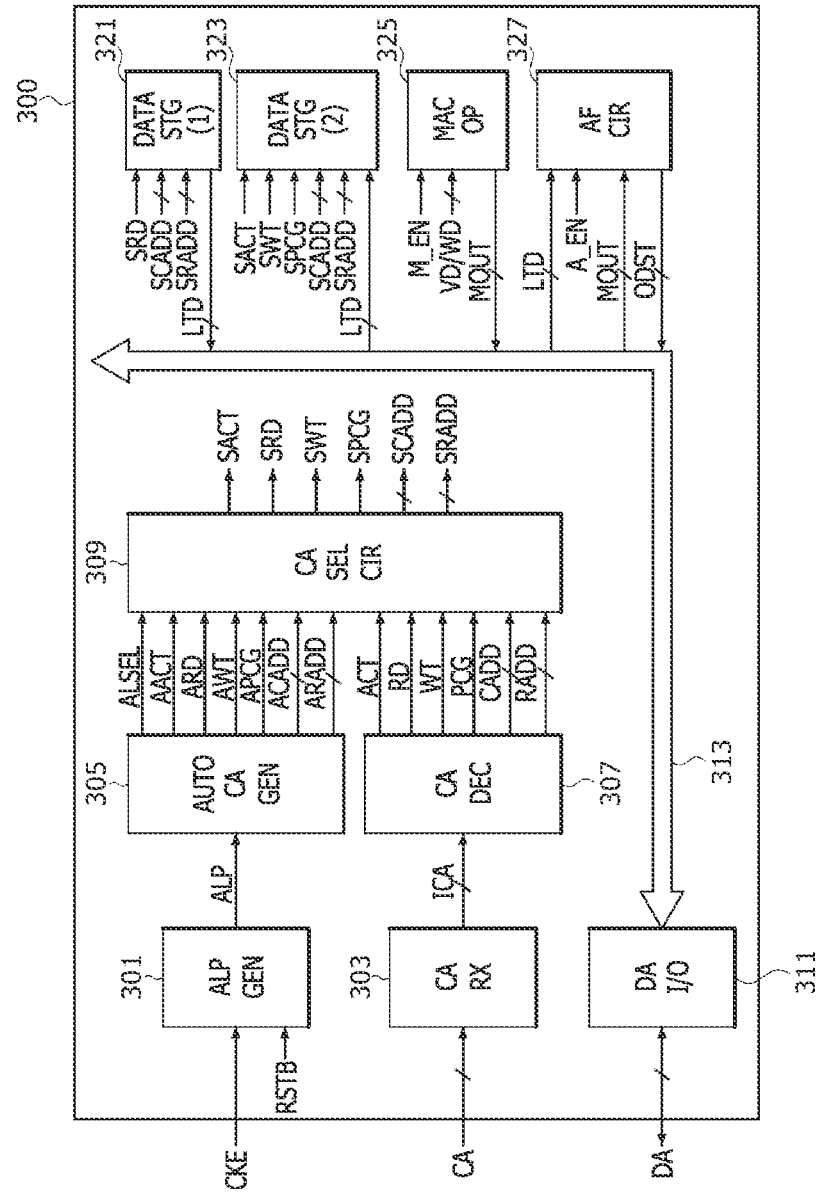
FIG. 19 is a block diagram illustrating a configuration of an arithmetic device for neural networks according to yet still another embodiment of the present embodiment.

As illustrated in FIG. 19, an arithmetic device 300, according to yet still another embodiment, may include an auto-load pulse generation circuit (ALP GEN) 301, a command/address reception circuit (CA RX) 303, an auto-command/address generation circuit (AUTO CA GEN) 305, a command/address decoder (CA DEC) 307, a command/address selection circuit (CA SEL CIR) 309, a data I/O circuit (DA I/O) 311, a data line 313, a first data storage circuit (DATA STG(1)) 321, a second data storage circuit (DATA STG(2)) 323, a MAC operator (MAC OP) 325, and an AF circuit (AF CIR) 327.

The auto-load pulse generation circuit 301 may receive a clock enablement signal CKE from an external device that is coupled to the arithmetic device 300. The clock enablement signal CKE may be activated for internal operations after an initialization operation terminates. The auto-load pulse generation circuit 301 may generate an auto-load pulse ALP based on the clock enablement signal CKE and a reset signal RSTB. The reset signal RSTB may be activated for the initialization operation. The reset signal RSTB may be generated by an internal circuit that is included in the arithmetic device 300 or may be provided by the external device. The auto-load pulse generation circuit 301 may generate the auto-load pulse ALP for an auto-load operation when the clock enablement signal CKE is activated while the reset signal RSTB is being deactivated after the termination of the initialization operation. In the present embodiment, the auto-load pulse ALP may be activated to have a logic "high" level during a predetermined period. However, the present embodiment may be merely an example of the present disclosure. Thus, the present disclosure is not limited to the present embodiment.

The command/address reception circuit 303 may extract a command and an address from a command/address signal CA and may output the extracted command and the extracted address as an internal command/address signal ICA.

The auto-command/address generation circuit 305 may receive the auto-load pulse ALP from the auto-load pulse generation circuit 301. The auto-command/address generation circuit 305 may output an auto-load selection signal ALSEL that is activated when the auto-load pulse ALP is activated. The auto-load selection signal ALSEL may be activated for execution of the auto-load operation. The auto-command/address generation circuit 305 may sequentially generate the auto-load selection signal ALSEL and an auto-load command. The auto-load command may include an auto-active signal AACT, an auto-read signal ARD, an auto-write signal AWT, and an auto-pre-charge signal APCG. The auto-command/address generation circuit 305 may sequentially generate the auto-active signal AACT, the auto-read signal ARD, the auto-write signal AWT, and the auto-pre-charge signal APCG based on the auto-load operation while the auto-load selection signal ALSEL is being activated and may output an auto-column address ACADD and an auto-row address ARADD, a logic level combination of at least one of which is changed for a next auto-load operation after the termination of the auto-load operation.

The command/address decoder 307 may decode the internal command/address signal ICA to generate an active signal ACT, a read signal RD, a write signal WT, a pre-charge signal PCG, a column address CADD, and a row address RADD.

The command/address selection circuit 309 may generate a selection active signal SACT, a selection read signal SRD, a selection write signal SWT, a selection pre-charge signal SPCG, a selection column address SCADD, and a selection row address SRADD based on the auto-active signal AACT, the auto-read signal ARD, the auto-write signal AWT, the auto-pre-charge signal APCG, the auto-column address ACADD, the auto-row address ARADD, the active signal ACT, the read signal RD, the write signal WT, the pre-charge signal PCG, the column address CADD, and the row address RADD based on the auto-load selection signal ALSEL.

The data I/O circuit 311 may receive external data DA from the external device and may transmit the external data DA to at least one of the first data storage circuit 321, the second data storage circuit 323, the MAC operator 325, and the AF circuit 327 through the data line 313. The data I/O circuit 311 may output the data, which is output from at least one of the first data storage circuit 321, the second data storage circuit 323, the MAC operator 325, and the AF circuit 327 through the data line 313, as the external data DA.

The first data storage circuit 321 may include an array of e-fuses. Various activation functions may be stored in the first data storage circuit 321 as look-up table data (LTD) and in hardware. When the selection read signal SRD is activated, the first data storage circuit 321 may output the look-up table data LTD, which are stored in data storage units (DSUs of FIG. 13), accessed by the selection column address SCADD and the selection row address SRADD, through the data line 313 for an auto-read operation.

The second data storage circuit 323 may perform an auto-write operation that stores the look-up table data LTD, which is output from the first data storage circuit 321, into the second data storage circuit 323 based on the selection active signal SACT, the selection write signal SWT, the selection pre-charge signal SPCG, the selection column address SCADD, and the selection row address SRADD.

The MAC operator 325 may perform a MAC arithmetic operation of vector data VD and weight data WD based on an arithmetic control signal M_EN, thereby generating an arithmetic result signal MOUT.

The AF circuit 327 may perform an activation operation based on an activation control signal A_EN to generate an output distribution signal ODST based on the arithmetic result signal MOUT. The AF circuit 327 may receive the look-up table data LTD from the first data storage circuit 321 or the second data storage circuit 323 and may store the look-up table data LTD therein. When the activation operation is performed, the AF circuit 327 may select and output the output distribution signal ODST based on the arithmetic result signal MOUT and the look-up table data LTD, the look-up table data LTD corresponding to the activation function.

Figure 20:
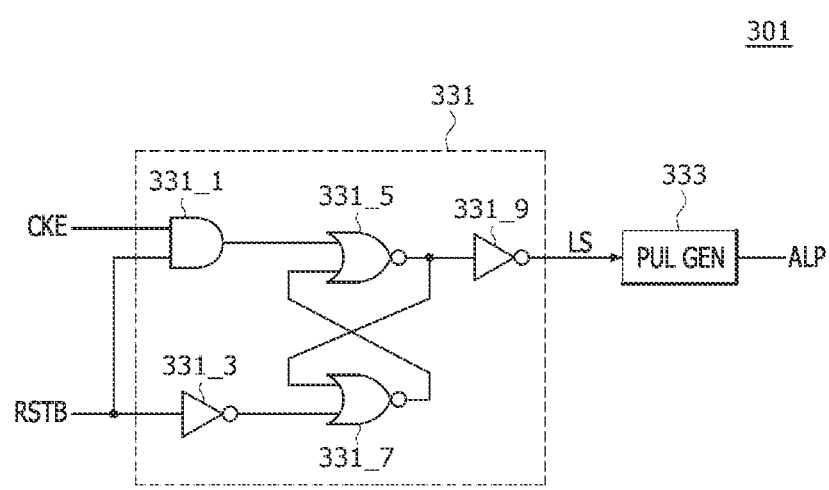
FIG. 20 illustrates a configuration of an auto-load pulse generation circuit included in the arithmetic device illustrated in FIG. 19.

Referring to FIG. 20, the auto-load pulse generation circuit 301 may include a latch signal generation circuit 331 and a pulse generation circuit (PUL GEN) 333.

The latch signal generation circuit 331 may include an AND gate 331_1, inverters 331_3 and 331_9, and NOR gates 331_5 and 331_7. The AND gate 331_1 may receive the clock enablement signal CKE and the reset signal RSTB to perform a logical AND operation of the clock enablement signal CKE and the reset signal RSTB. The inverter 331_3 may inversely buffer the reset signal RSTB to output the inversely buffered signal of the reset signal RSTB. The NOR gate 3315 may receive an output signal of the AND gate 331_1 and an output signal of the NOR gate 331_7 to perform a logical NOR operation of the output signal of the AND gate 331_1 and the output signal of the NOR gate 331_7. The NOR gate 331_7 may receive an output signal of the inverter 331_3 and an output signal of the NOR gate 331_5 to perform a logical NOR operation of the output signal of the inverter 331_3 and the output signal of the NOR gate 331_5. The inverter 3319 may inversely buffer the output signal of the NOR gate 331_5 to output the inversely buffered signal of the output signal of the NOR gate 331_5 as a latch signal LS. The latch signal generation circuit 331 may generate the latch signal LS with a logic "low" level when the reset signal RSTB activated to have a logic "low" level is input to the latch signal generation circuit 331 to perform the initialization operation. The latch signal generation circuit 331 may generate the latch signal LS with a logic "high" level when the clock enablement signal CKE is activated to have a logic "high" level while the reset signal RSTB is being deactivated to have a logic "high" level through the termination of the initialization operation.

The pulse generation circuit 333 may receive the latch signal LS from the latch signal generation circuit 331. The pulse generation circuit 333 may generate the auto-load pulse ALP when the latch signal LS has a logic "high" level. The auto-load pulse ALP may be generated to have a logic "high" level during a predetermined period.

Figure 21:
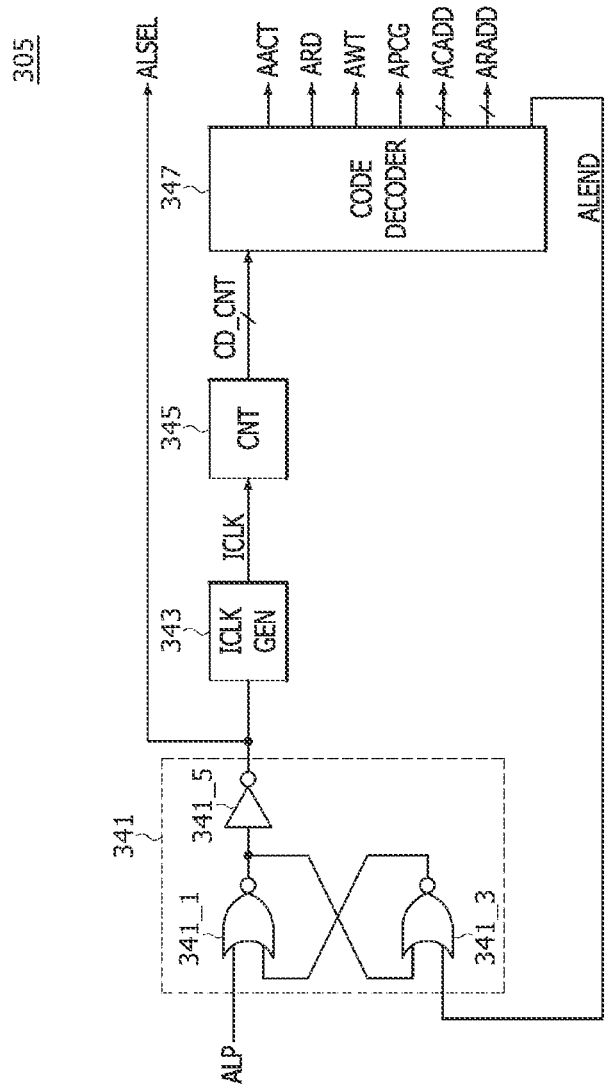
FIG. 21 illustrates a configuration of an auto-command/address generation circuit included in the arithmetic device illustrated in FIG. 19.

Referring to FIG. 21, the auto-command/address generation circuit 305 may include an auto-load selection signal latch circuit 341, an internal clock generation circuit (ICLK GEN) 343, a counter (CNT) 345, and a code decoder 347.

The auto-load selection signal latch circuit 341 may receive the auto-load pulse ALP from the auto-load pulse generation circuit 301 and may receive an auto-load end signal ALEND from the code decoder 347. The auto-load selection signal latch circuit 341 may include NOR gates 341_1 and 341_3 and an inverter 341_5. The NOR gate 341_1 may receive the auto-load pulse ALP and an output signal of the NOR gate 341_3 to perform a logical NOR operation of the auto-load pulse ALP and the output signal of the NOR gate 231_3. The NOR gate 341_3 may receive the auto-load end signal ALEND and an output signal of the NOR gate 341_1 to perform a logical NOR operation of the auto-load end signal ALEND and the output signal of the NOR gate 341_1. The inverter 341_5 may inversely buffer the output signal of the NOR gate 341_1 to output the inversely buffered signal of the output signal of the NOR gate 341_1 as the auto-load selection signal ALSEL. The auto-load selection signal latch circuit 341 may activate the auto-load selection signal ALSEL to a logic "high" level when the auto-load pulse ALP is activated to have a logic "high" level. The auto-load selection signal latch circuit 341 may deactivate the auto-load selection signal ALSEL to a logic "low" level when the auto-load end signal ALEND is activated to have a logic "high" level for the termination of the auto-load operation.

The internal clock generation circuit 343, the counter 345, and the code decoder 347 may have the same configuration as the internal clock generation circuit 233, the counter 235, and the code decoder 237, illustrated in FIG. 11, respectively. Thus, detailed descriptions for configurations and operations of the internal clock generation circuit 343, the counter 345, and the code decoder 347 will be omitted hereinafter.

The auto-load operation of the arithmetic device 300 with the aforementioned configuration will be described hereinafter with reference to FIGS. 22 to 24, in conjunction with the auto-read operation to read out the first to $M^{th}$ look-up table data LTD(1)~LTD(M) from the first data storage circuit 321 and in conjunction with the auto-write operation to write the first to $M^{th}$ look-up table data LTD(1)~LTD(M) into the second data storage circuit 323.

Figure 22:
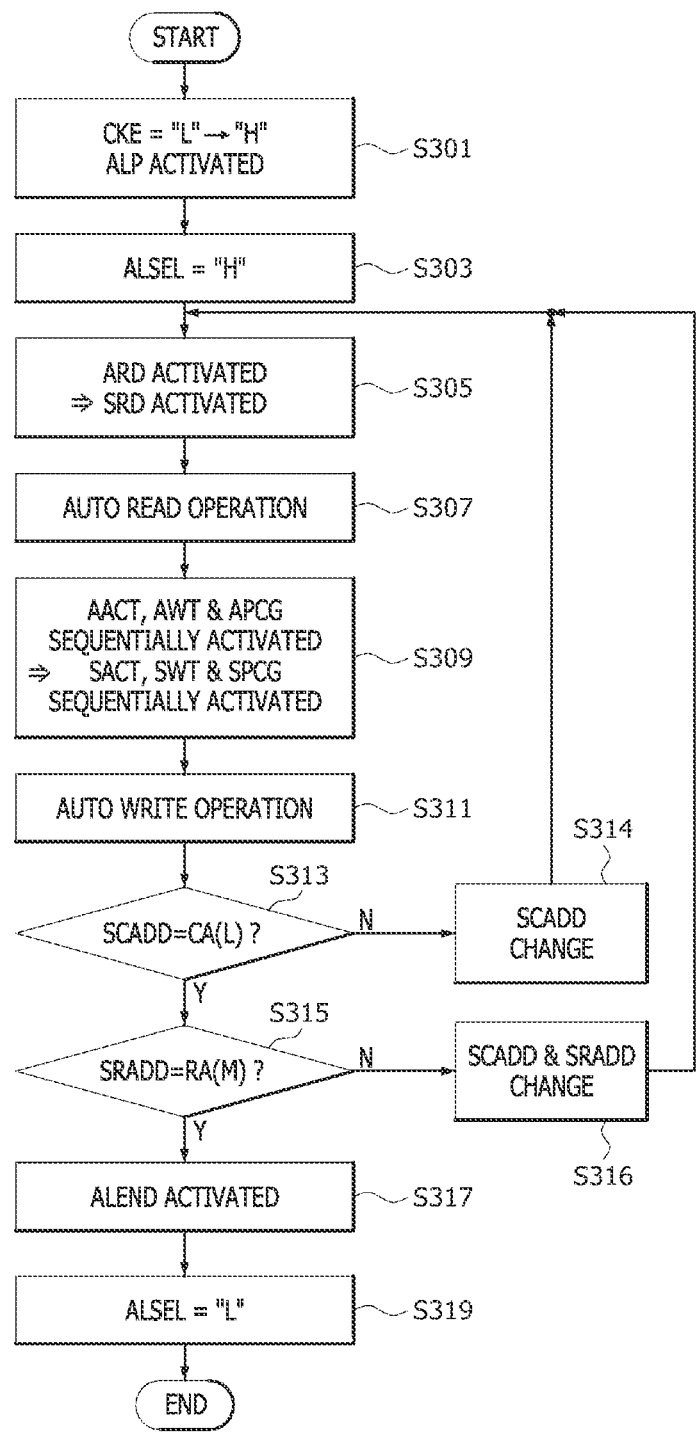
FIGS. 22 to 24 illustrate an operation of the arithmetic device illustrated in FIGS. 19 to 21.
Figure 23:
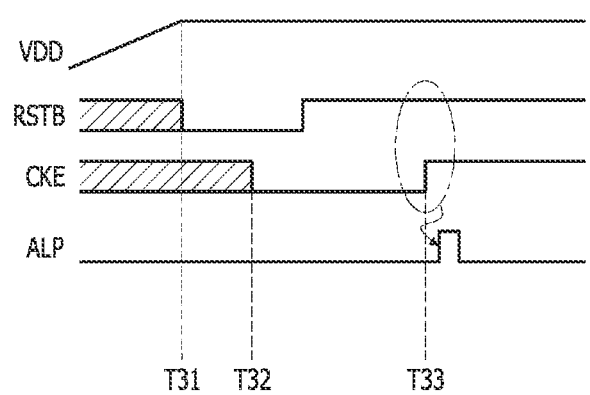
Figure 24:
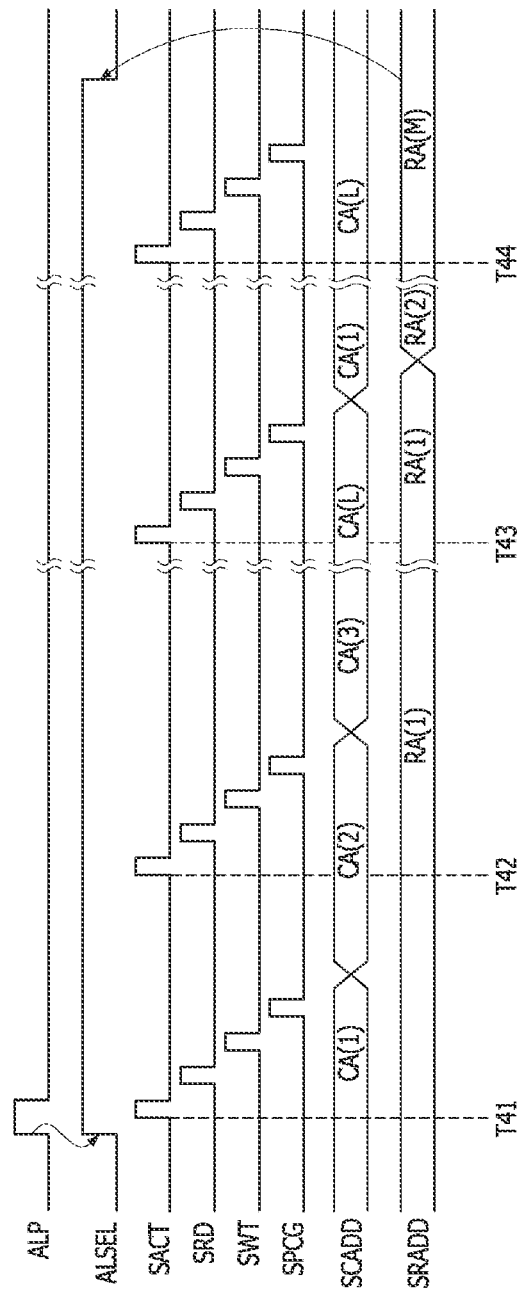

As illustrated in FIGS. 22 and 24, when the clock enablement signal CKE is activated to have a logic "high(H)" level while the reset signal RSTB is being deactivated to have a logic "high(H)" level through the termination of the initialization operation, which is performed after a power source voltage VDD is boosted to a predetermined target level, the auto-load pulse ALP that is activated for the auto-load operation may be generated (see a step S301).

An operation that generates the auto-load pulse ALP will be described in more detail hereinafter with reference to FIG. 23. First, after the power source voltage VDD is boosted to the predetermined target level at time "T31", the reset signal RSTB may be activated to have a logic "low" level to perform the initialization operation. The level of the clock enablement signal CKE that is set to have a logic "low" level at time "T32" may be changed into a logic "high" level at time "T33". If the clock enablement signal CKE is activated to have a logic "high" level at time "T33", the auto-load pulse ALP that is activated to have a logic "high" level may be generated.

As illustrated in FIGS. 22 and 24, the auto-load selection signal ALSEL may be activated to have a logic "high(H)" level by the activated auto-load pulse ALP (see a step S303). When the auto-read signal ARD is activated while the selection column address SCADD that is generated based on the auto-column address ACADD has a first column address combination CA<1> and the selection row address SRADD that is generated based on the auto-row address ARADD has a first row address combination RA<1>, between time "T41" and time "T42", the selection read signal SRD may be activated (see a step S305) to perform the auto-read operation (see a step S307). The auto-read operation may be performed in a way that reads out the data that is stored in the first data storage circuit 321, which is accessed by the selection column address SCADD with the first column address combination CA<1> and the selection row address SRADD with the first row address combination RA<1>.

As illustrated in FIGS. 22 and 24, when the auto-active signal AACT, the auto-write signal AWT, and the auto-pre-charge signal APCG are sequentially activated between time "T41" and time "T42", the selection active signal SACT, the selection write signal SWT, and the selection pre-charge signal SPCG may be sequentially activated (see a step S309) to perform the auto-write operation (see a step S311). The auto-write operation may be performed in a way that writes the data that is read out of the first data storage circuit 321 into the second data storage circuit 323, which is accessed by the selection column address SCADD with the first column address combination CA<1> and the selection row address SRADD with the first row address combination RA<1>.

As illustrated in FIGS. 22 and 24, when the auto-write operation terminates between time "T41" and time "T42", the logic level combination of the selection column address SCADD may change from the first column address combination CA<1> to the second column address combination CA<2> (see a step S314) because a logic level combination of the selection column address SCADD is not an $L^{th}$ column address combination CA<L> (see a step S313).

As illustrated in FIGS. 22 and 24, between time "T42" and time "T43", the auto-read operation may be performed to read out the data that is stored in the first data storage circuit 321, which is accessed by the selection column address SCADD with the second column address combination CA<2> and the selection row address SRADD with the first row address combination RA<1> (see the steps S305 and S307). In addition, between time "T42" and time "T43", the auto-write operation may also be performed to write the data that is read out of the first data storage circuit 321 into the second data storage circuit 223, which is accessed by the selection column address SCADD with the second column address combination CA<2> and the selection row address SRADD with the first row address combination RA<1> (see the steps S309 and S311). When the auto-write operation terminates between time "T42" and time "T43", a logic level combination of the selection column address SCADD may change from the second column address combination CA<2> to the third column address combination CA<3> (see the step S314) because a logic level combination of the selection column address SCADD is not the $L^{th}$ column address combination CA<L> (see the step S313).

As illustrated in FIGS. 22 and 24, between time "T43" and time "T44", the auto-read operation may be performed to read out the data that is stored in the first data storage circuit 321, which is accessed by the selection column address SCADD with the $L^{th}$ column address combination CA<L> and the selection row address SRADD with the first row address combination RA<1> (see the steps S305 and S307). In addition, between time "T43" and time "T44", the auto-write operation may also be performed to write the data that is read out of the first data storage circuit 321 into the second data storage circuit 323, which is accessed by the selection column address SCADD with the $L^{th}$ column address combination CA<L> and the selection row address SRADD with the first row address combination RA<1> (see the steps S309 and S311).

As illustrated in FIGS. 22 and 24, when the auto-read operation and the auto-write operation are performed 'L' times, respectively, between time "T41" and time "T44", the first look-up table data LTD(1) that corresponds to the first activation function may be read out of the first data storage circuit 321 and may be written into the second data storage circuit 323 to terminate the auto-load operation. When the auto-load operation for the first activation function terminates, logic level combinations of the selection column address SCADD and the selection row address SRADD may be changed to perform the auto-load operation for the second activation function. More specifically, when a logic level combination of the selection row address SRADD is inconsistent with an $M^{th}$ row address combination RA<M> (see a step S315), the logic level combination of the selection column address SCADD may change from the $L^{th}$ column address combination CA<L> to the first column address combination CA<1> and a logic level combination of the selection row address SRADD may change from the first row address combination RA<1> to the second row address combination RA<2> (see a step S316).

As illustrated in FIGS. 22 and 24, when all of the auto-load operations for the second to $M^{th}$ activation functions terminate after time "T44", the auto-load end signal ALEND may be activated (see a step S317) because the selection row address SRADD has a logic level combination of the $M^{th}$ row address combination RA<M> (see the step S315) and the auto-load selection signal ALSEL may be deactivated to have a logic "low(L)" level to terminate the auto-load operation (see a step S319).

As described above, the arithmetic device 300, according to the present embodiment, may read out the activation functions that are stored in hardware in the first data storage circuit 321 to perform the auto-load operation to write the activation functions into the second data storage circuit 323. Thus, it may be possible to more readily load the activation functions that are used for the activation operation into the second data storage circuit 323 as look-up table data.

Figure 25:
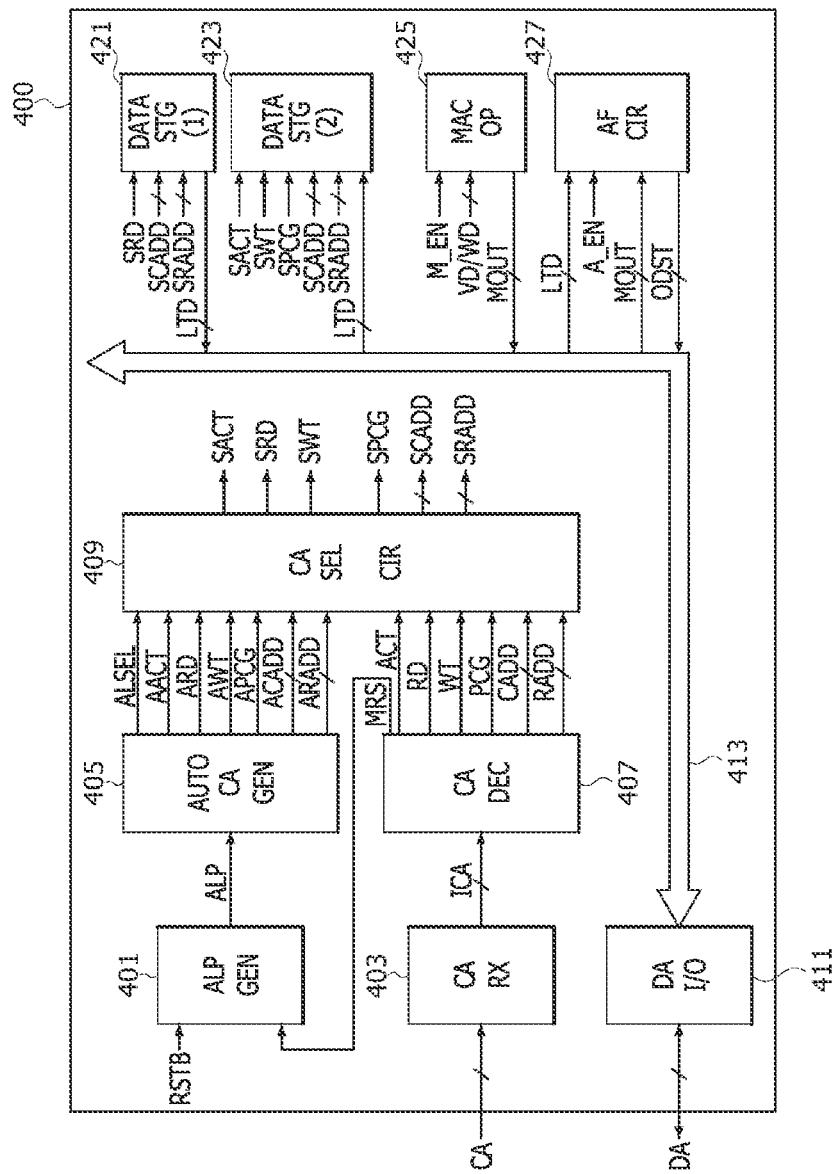
FIG. 25 is a block diagram illustrating a configuration of an arithmetic device for neural networks according to further another embodiment of the present embodiment.

As illustrated in FIG. 25, an arithmetic device 400, according to further another embodiment, may include an auto-load pulse generation circuit (ALP GEN) 401, a command/address reception circuit (CA RX) 403, an auto-command/address generation circuit (AUTO CA GEN) 405, a command/address decoder (CA DEC) 407, a command/address selection circuit (CA SEL CIR) 409, a data I/O circuit (DA I/O) 411, a data line 413, a first data storage circuit (DATA STG(1)) 421, a second data storage circuit (DATA STG(2)) 423, a MAC operator (MAC OP) 425, and an AF circuit (AF CIR) 427.

The auto-load pulse generation circuit 401 may receive a reset signal RSTB from an external device that is coupled to the arithmetic device 400. The auto-load pulse generation circuit 401 may receive a mode register set signal MRS from the command/address decoder 407. The mode register set signal MRS may be activated for a mode register set operation that stores information (e.g., a burst length, a latency, and the like) that is necessary for internal operations into a mode register (not shown). The auto-load pulse generation circuit 401 may generate an auto-load pulse ALP based on the mode register set signal MRS and the reset signal RSTB. The auto-load pulse generation circuit 401 may generate the auto-load pulse ALP for an auto-load operation when the mode register set signal MRS is activated while the reset signal RSTB is being deactivated after the termination of an initialization operation. In the present embodiment, the auto-load pulse ALP may be activated to have a logic "high" level during a predetermined period. However, the present embodiment may be merely an example of the present disclosure. Thus, the present disclosure is not limited to the present embodiment.

The command/address decoder 407 may decode an internal command/address signal ICA, output from the command/address reception circuit 403, to generate the mode register set signal MRS, an active signal ACT, a read signal RD, a write signal WT, a pre-charge signal PCG, a column address CADD, and a row address RADD for a normal operation.

The command/address reception circuit 403, the auto-command/address generation circuit 405, the command/address selection circuit 409, the data I/O circuit 411, the data line 413, the first data storage circuit 421, the second data storage circuit 423, the MAC operator 425, and the AF circuit 427 may have the same configuration as the command/address reception circuit 303, the auto-command/address generation circuit 305, the command/address selection circuit 309, the data I/O circuit 311, the data line 313, the first data storage circuit 321, the second data storage circuit 323, the MAC operator 325, and the AF circuit 327, which are illustrated in FIG. 19, respectively. Thus, detailed descriptions for configurations and operations of the command/address reception circuit 403, the auto-command/address generation circuit 405, the command/address selection circuit 409, the data I/O circuit 411, the data line 413, the first data storage circuit 421, the second data storage circuit 423, the MAC operator 425, and the AF circuit 427 will be omitted hereinafter.

Figure 26:
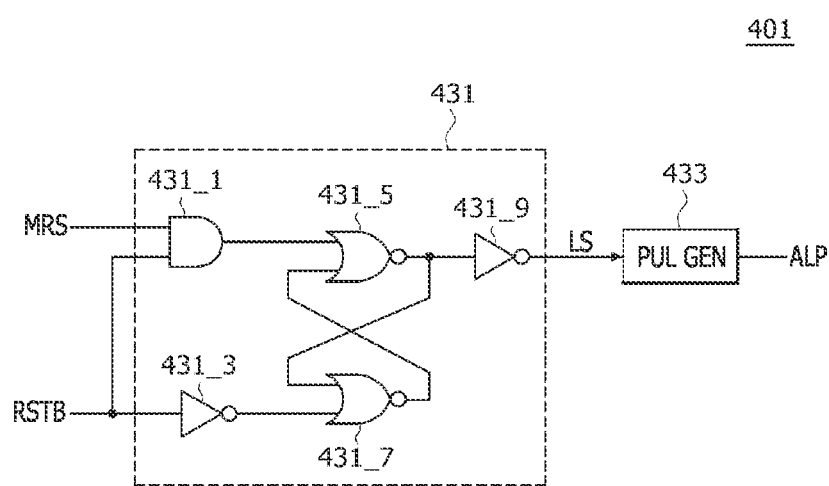
FIG. 26 illustrates a configuration of an auto-load pulse generation circuit included in the arithmetic device illustrated in FIG. 25.

Referring to FIG. 26, the auto-load pulse generation circuit 401 may include a latch signal generation circuit 431 and a pulse generation circuit (PUL GEN) 433. The latch signal generation circuit 431 may generate a latch signal LS with a logic "high" level when the mode register set signal MRS is activated to have a logic "high" level while the reset signal RSTB is being deactivated to have a logic "high" level through the termination of the initialization operation. The latch signal generation circuit 431 and the pulse generation circuit 433 may have the same configuration as the latch signal generation circuit 331 and the pulse generation circuit 333 illustrated in FIG. 20, respectively. Thus, detailed descriptions for configurations and operations of the latch signal generation circuit 431 and the pulse generation circuit 433 will be omitted hereinafter.

The auto-load operation of the arithmetic device 400 with the aforementioned configuration will be described hereinafter with reference to with FIGS. 27 and 28 in conjunction with the auto-read operation for reading out the first to $M^{th}$ look-up table data LTD(1)~LTD(M) from the first data storage circuit 421 and in conjunction with the auto-write operation for writing the first to $M^{th}$ look-up table data LTD(1)~LTD(M) into the second data storage circuit 423.

Figure 27:
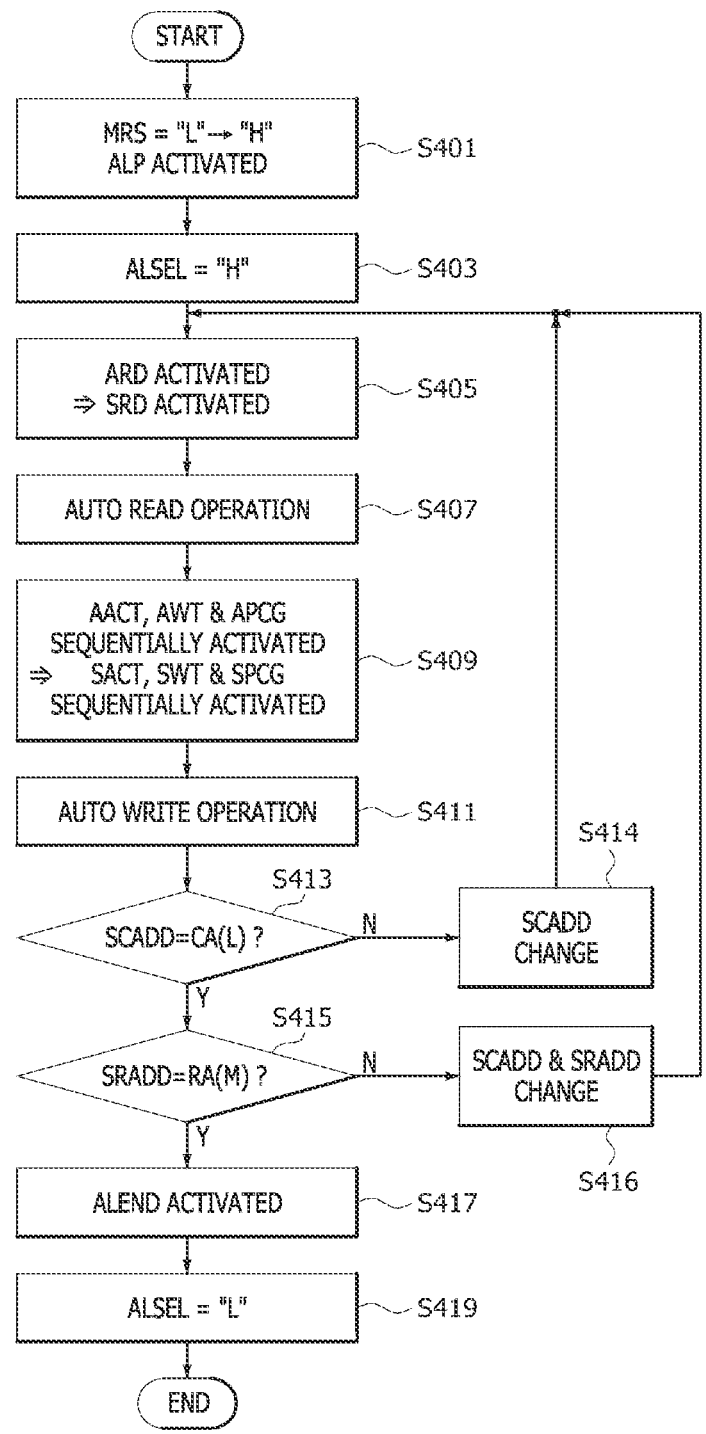
FIGS. 27 and 28 illustrate an operation of the arithmetic device illustrated in FIGS. 25 and 26.
Figure 28:
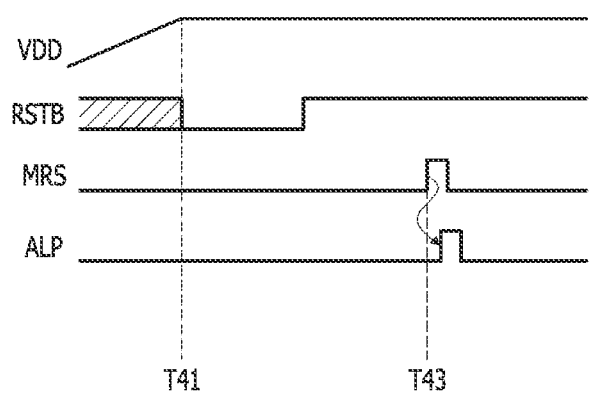

As illustrated in FIG. 27, when the mode register set signal MRS is activated while the reset signal RSTB is being deactivated through the termination of the initialization operation, the auto-load pulse ALP activated for the auto-load operation may be generated (see a step S401).

An operation for generating the auto-load pulse ALP will be described in more detail hereinafter with reference to FIG. 28. First, after the power source voltage VDD is boosted to the predetermined target level at time "T41", the reset signal RSTB may be activated to have a logic "low" level to perform the initialization operation. If the mode register set signal MRS is activated to have a logic "high" level at time "T43" after the reset signal RSTB is deactivated to have a logic "high" level through the termination of the initialization operation, the auto-load pulse ALP that is activated to have a logic "high" level may be generated.

In FIG. 27, step S403 of activating the auto-load selection signal ALSEL, steps S405 and S407 of performing the auto-read operation, steps S409 and S411 of performing the auto-write operation, steps S413, S414, S415, and S416 of changing logic level combinations of the selection column address SCADD and the selection row address SRADD for a next auto-load operation, and steps S417 and S419 of inactivating the auto-load selection signal ALSEL and terminating the auto-load operation may be similar to steps S303, S305, S307, S309, S311, S313, S314, S315, S316, S317, and S319 of FIG. 22. Thus, detailed descriptions of the steps S403, S405, S407, S409, S411, S413, S414, S415, S416, S417, and S419 will be omitted hereinafter.

As described above, the arithmetic device 400 according to the present embodiment may read out the activation functions stored in hardware in the first data storage circuit 421 to perform the auto-load operation for writing the activation functions into the second data storage circuit 423. Thus, it may be possible to more readily load the activation functions used for the activation operation into the second data storage circuit 423 as look-up table data.

What is claimed is:

1. An arithmetic device comprising:
an auto-command/address generation circuit configured to sequentially activate an auto-load selection signal and an auto-load command for an auto-load operation when a power-up pulse is activated, wherein the auto-command/address generation circuit is configured to change at least one of an auto-column address and an auto-row address for a next auto-load operation when the auto-load operation terminates;
a first data storage circuit configured to output look-up table data, corresponding to an activation function, based on the auto-load command; and
a second data storage circuit configured to store the look-up table data, output from the first data storage circuit, based on the auto-load command,
wherein the auto-load selection signal is generated from based on the power-up pulse and an auto-load end signal.

2. The arithmetic device of claim 1,
wherein the auto-load operation incudes an auto-read operation and an autowrite operation.

3. The arithmetic device of claim 2,
wherein the auto-command/address generation circuit generates an auto-read signal for the auto-read operation; and
wherein the auto-read signal is included in the auto-load command.

4. The arithmetic device of claim 2,
wherein the auto-command/address generation circuit generates an auto-active signal, an auto-write signal, and an auto-pre-charge signal for the auto-write operation; and
wherein the auto-active signal, the auto-write signal, and the auto-pre-charge signal are included in the auto-load command.

5. The arithmetic device of claim 1,
wherein the auto-command/address generation circuit receives the powerup pulse that is activated when a power source voltage is boosted to have a level that is consistent with or higher than a predetermined target level.

6. The arithmetic device of claim 1,
wherein the auto-load command includes an auto-active signal, an auto-read signal, an auto-write signal, and an auto-pre-charge signal; and
wherein the auto-command/address generation circuit includes:
an auto-load selection signal latch circuit configured to generate the autoload selection signal;
a counter configured to count an internal clock signal, which is toggled by the auto-load selection signal, to generate a counted code; and
a code decoder configured to:
sequentially activate the auto-load selection signal, the autoactive signal, the auto-read signal, the auto-write signal, and the auto-pre-charge signal based on the counted code; and
generate the auto-load end signal when the auto-load operation terminates.

7. The arithmetic device of claim 1,
wherein the auto-load command includes an auto-read signal;
wherein the first data storage circuit includes at least one data storage unit, storing the look-up table data in hardware, and outputs the look-up table data that is stored in the data storage unit, which is accessed based on a selection column address and a selection row address, when a selection read signal is activated;
wherein the selection read signal is generated based on the auto-read signal;
wherein the selection column address is generated based on the auto-column address; and
wherein the selection row address is generated based on the auto-row address.

8. The arithmetic device of claim 1,
wherein the auto-load command includes an auto-active signal, an auto-write signal, and an auto-pre-charge signal;
wherein the second data storage circuit includes a plurality of memory cells and writes the look-up table data into one of the plurality of memory cells, which is accessed based on a selection column address and a selection row address, when a selection active signal, a selection write signal, and a selection pre-charge signal are sequentially activated;
wherein the selection active signal is generated based on the auto-active signal;
wherein the selection write signal is generated based on the auto-write signal;
wherein the selection pre-charge signal is generated based on the auto-precharge signal;
wherein the selection column address is generated based on the auto-column address; and
wherein the selection row address is generated based on the auto-row address.

9. The arithmetic device of claim 1,
wherein the auto-load end signal is generated when the auto-load operation terminates.

* * * * *